United States Patent
Sirohiwala et al.

(10) Patent No.: US 10,066,964 B2
(45) Date of Patent: Sep. 4, 2018

(54) MAGNETIC FIELD SENSOR AND ASSOCIATED METHOD THAT CAN SENSE A POSITION OF A MAGNET

(71) Applicant: Allegro MicroSystems, LLC, Worcester, MA (US)

(72) Inventors: Ali Husain Yusuf Sirohiwala, Somerville, MA (US); James Rice, Lafayette, CO (US)

(73) Assignee: Allegro Microsystems, LLC, Manchester, NH (US)

( * ) Notice: Subject to any disclaimer, the term of this patent is extended or adjusted under 35 U.S.C. 154(b) by 10 days.

(21) Appl. No.: 15/419,242

(22) Filed: Jan. 30, 2017

(65) Prior Publication Data

US 2017/0146367 A1    May 25, 2017

Related U.S. Application Data

(62) Division of application No. 14/748,823, filed on Jun. 24, 2015.

(60) Provisional application No. 62/016,772, filed on Jun. 25, 2014.

(51) Int. Cl.
| | |
|---|---|
| G01B 7/14 | (2006.01) |
| G01D 5/14 | (2006.01) |
| H01F 7/02 | (2006.01) |
| G01D 5/165 | (2006.01) |

(52) U.S. Cl.
CPC ............. G01D 5/145 (2013.01); G01D 5/165 (2013.01); H01F 7/021 (2013.01)

(58) Field of Classification Search
CPC .............................. G01D 5/145; G01D 5/165

USPC ........................................................ 324/207.2
See application file for complete search history.

(56) References Cited

U.S. PATENT DOCUMENTS

| | | | |
|---|---|---|---|
| 5,359,287 | A | 10/1994 | Watanabe et al. |
| 6,131,457 | A | 10/2000 | Sato |
| 6,288,533 | B1 | 9/2001 | Haeberli et al. |
| 6,580,269 | B2 | 6/2003 | Hiligsmann et al. |
| 7,098,654 | B2 * | 8/2006 | Mehnert ................. G01P 3/487 |
| | | | 324/207.24 |
| 7,932,718 | B1 | 4/2011 | Wiegert |
| 8,575,929 | B1 | 11/2013 | Wiegert |
| 2008/0184799 | A1 | 8/2008 | Phan Le et al. |
| 2011/0298447 | A1 | 12/2011 | Foletto et al. |
| 2012/0274563 | A1 | 11/2012 | Olsson |
| 2012/0280679 | A1 | 11/2012 | Shelton |
| 2013/0147642 | A1 | 6/2013 | Rubio et al. |
| 2013/0261990 | A1 | 10/2013 | Ura |
| 2014/0225596 | A1 | 8/2014 | Nakamura et al. |
| 2015/0042320 | A1 | 2/2015 | Cadugan et al. |
| 2015/0377648 | A1 | 12/2015 | Sirohiwala et al. |

(Continued)

OTHER PUBLICATIONS

Notice of Allowance dated Sep. 18, 2017 for U.S. Appl. No. 14/748,823; 5 pages.

(Continued)

Primary Examiner — Reena Aurora
(74) Attorney, Agent, or Firm — Daly, Crowley, Mofford & Durkee, LLP

(57) ABSTRACT

A magnetic field sensor, a magnetic assembly, and a method provide circuits and techniques for or measuring one or more displacement angles of a magnet using magnetic field sensing elements. Applications include, but are not limited to, joysticks.

31 Claims, 15 Drawing Sheets

(56) References Cited

U.S. PATENT DOCUMENTS

2016/0178400 A1    6/2016   Vuillermet et al.
2016/0334830 A1    11/2016   Sirohiwala et al.

OTHER PUBLICATIONS

Response with RCE filed on Jun. 7, 2016 to the Final Office Action dated Jan. 7, 2016; for U.S. Appl. No. 13/960,910, 15 pages.
Response filed on Apr. 4, 2016 to the Office Action dated Jan. 7, 2016; for U.S. Appl. No. 13/960,910; 12 pages.
Response to Office Action filed on Dec. 28, 2016 for U.S. Appl. No. 13/960,910, 11 pages.
Response filed Sep. 9, 2016 to Non-Final Office Action dated Jul. 1, 2016; for U.S. Appl. No. 13/960,910; 11 pages.
Response filed on Nov. 11, 2015 to Office Action dated Aug. 18, 2015; for U.S. Appl. No. 13/960,910, 12 pages.
Office Action dated Aug. 18, 2015; for U.S. Appl. No. 13/960,910; 22 pages.
Non-Final Office Action dated Jul. 1, 2016; for U.S. Appl. No. 13/960,910; 22 pages.
Final Office Action dated Sep. 28, 2016; for U.S. Appl. No. 13/960,910; 27 pages.
Final Office Action dated Jan. 7, 2016; for U.S. Appl. No. 13/960,910; 20 pages.
Advisory Action dated Apr. 20, 2016, for U.S. Appl. No. 13/960,910; 5 pages.
Office Action dated Apr. 11, 2017 for U.S. Appl. No. 14/748,823; 14 pages.
Response to Office Action filed on Jun. 20, 2017 for U.S. Appl. No. 14/748,823; 13 pages.

* cited by examiner

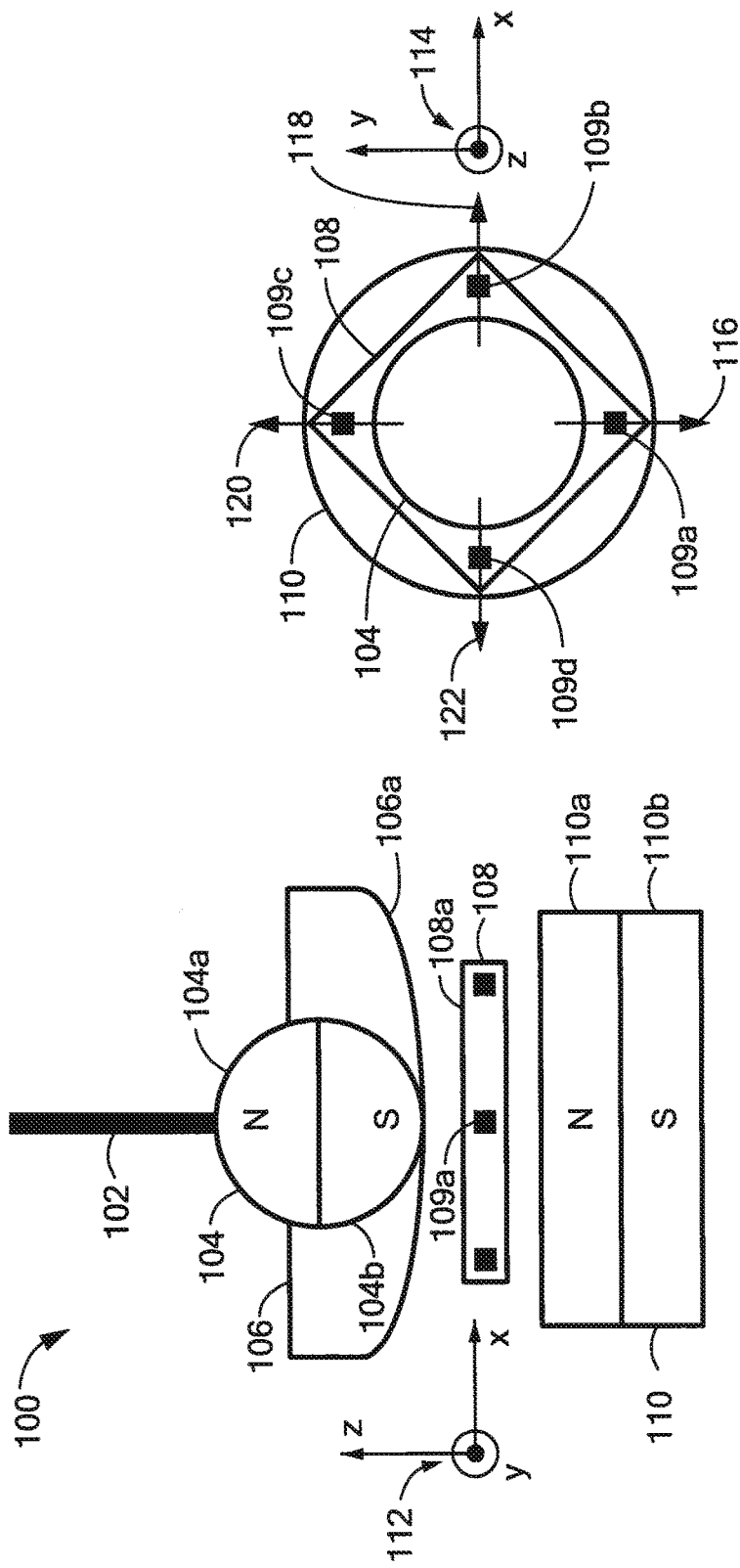

MAGNETIC FIELD SENSOR AND ASSOCIATED METHOD THAT CAN SENSE A POSITION OF A MAGNET

CROSS REFERENCE TO RELATED APPLICATIONS

This application is a Divisional Application of and claims the benefit of U.S. patent application Ser. No. 14/748,823 filed Jun. 24, 2015, which claims the benefit of U.S. Provisional Patent Application No. 62/016,772 filed Jun. 25, 2014 both of which are incorporated herein by reference in their entirety.

STATEMENT REGARDING FEDERALLY SPONSORED RESEARCH

Not Applicable.

FIELD OF THE INVENTION

This invention relates generally to magnetic field sensors and, more particularly, to a magnetic field sensor that can sense the position of the magnet or a structure attached thereto.

BACKGROUND

Joystick assemblies are known. A known joystick has a shaft, which can be moved by a user, and electronics, which can sense the position of the shaft. Some known types of joysticks employ optical elements to sense a position of the shaft. Other known types of joysticks employ magnetic elements to sense a position of the shaft.

Known joysticks employ a restoring force, such that, when the user releases the shaft of the joystick, the shaft returns to the center zero position.

SUMMARY

The present invention provides a magnetic assembly that may be used in a joystick, or that may be used in other applications, for which magnets used in the magnetic assembly provide a restoring force, and for which movement of one of the magnets used in the magnetic assembly is sensed by electronic circuits associated therewith. An electronic circuit can be used in the magnetic assembly to provide one or more output signals representative of one or more angles associated with the magnets. A magnetic field sensor can include the electronic circuit.

In accordance with an example useful for understanding an aspect of the present invention, a magnetic field sensor includes an electronic circuit. The electronic circuit can include one or more of the following:

a substrate having a major surface disposed in an x-y plane;

first, second, third, and fourth magnetic field sensing elements disposed upon the major surface of the substrate and configured to generate first, second, third and fourth respective electronic magnetic field signals, wherein each electronic magnetic field signal is responsive to a respective magnetic field parallel to the major surface of the substrate, wherein the first and third magnetic field sensing elements have respective first and third maximum response axes parallel to each other, directed in opposite directions, and parallel to the major surface of the substrate, and wherein the second and fourth magnetic field sensing elements have respective second and fourth maximum response axes parallel to each other, directed in opposite directions, and parallel the major surface of the substrate, wherein the first and third major response axes are not parallel to the second and fourth major response axes;

a first differential circuit coupled to the first and third magnetic field sensing elements and configured to generate a first difference signal related to a difference between the first and third electronic magnetic field signals; or a second differential circuit coupled to the second and fourth magnetic field sensing elements and configured to generate a second difference signal related to a difference between the second and fourth electronic magnetic field signals, wherein the first difference signal has an amplitude related to a an x-axis projection upon the x-y plane and the second difference signal has an amplitude related to a y-axis projection upon the x-y plane.

In accordance with an example useful for understanding another aspect of the present invention, a magnetic assembly can include one or more of the following:

a first magnet having north and south magnetic poles;

a second magnet having north and south magnetic poles;

a movable shaft fixedly coupled to the second magnet such that movement of the movable shaft results in movement of the second magnet relative to the first magnet such that a line between centers of the north and south magnetic poles of the second magnet is movable relative to a line between the north and south magnetic poles of the first magnet, wherein an attraction of the second magnet to the first magnet result in a restoring force upon the shaft; or a magnetic field sensor disposed between the first and second magnets, wherein the magnetic field sensor comprises an electronic circuit. The electronic circuit can include one or more of the following:

a substrate having a major surface disposed in an x-y plane, wherein the line between centers of the north and south magnetic poles of the first magnet is perpendicular to the x-y plane;

first, second, third, and fourth magnetic field sensing elements disposed upon the major surface of the substrate and configured to generate first, second, third and fourth respective electronic magnetic field signals, wherein each electronic magnetic field signal is responsive to a respective magnetic field parallel to the major surface of the substrate, wherein the first and third magnetic field sensing elements have respective first and third maximum response axes parallel to each other, directed in opposite directions, and parallel the major surface of the substrate, and wherein the second and fourth magnetic field sensing elements have respective second and fourth maximum response axes parallel to each other, directed in opposite directions, and parallel the major surface of the substrate, wherein the first and third major response axes are not parallel to the second and fourth major response axes;

a first differential circuit coupled to the first and third magnetic field sensing elements and configured to generate a first difference signal related to a difference between the first and third electronic magnetic field signals; or a second differential circuit coupled to the second and fourth magnetic field sensing elements and configured to generate a second difference signal related to a difference between the second and fourth electronic magnetic field signals, wherein the first difference signal has an amplitude related to a an x-axis projection upon the x-y plane and the second difference signal has an amplitude related to a y-axis projection upon the x-y plane.

In accordance with an example useful for understanding another aspect of the present invention, a method of sensing a position of a magnet can include one or more of the following:

providing, upon a substrate, first, second, third, and fourth magnetic field sensing elements configured to generate first, second, third and fourth respective electronic magnetic field signals, wherein each electronic magnetic field signal is responsive to a respective magnetic field parallel to the major surface of the substrate, wherein the first and third magnetic field sensing elements have respective first and third maximum response axes parallel to each other, directed in opposite directions, and parallel to the major surface of the substrate, and wherein the second and fourth magnetic field sensing elements have respective second and fourth maximum response axes parallel to each other, directed in opposite directions, and parallel the major surface of the substrate, wherein the first and third major response axes are not parallel to the second and fourth major response axes;

generating a first difference signal related to a difference between the first and third electronic magnetic field signals; or generating a second difference signal related to a difference between the second and fourth electronic magnetic field signals.

In accordance with an example useful for understanding another aspect of the present invention, a method of sensing a position of a magnet can include one or more of the following:

providing a first magnet having north and south magnetic poles;

providing a second magnet having north and south magnetic poles;

providing a movable shaft fixedly coupled to the second magnet such that movement of the movable shaft results in movement of the second magnet relative to the first magnet such that a line between centers of the north and south magnetic poles of the second magnet is movable relative to a line between the north and south magnetic poles of the first magnet, wherein an attraction of the second magnet to the first magnet result in a restoring force upon the shaft; or providing a magnetic field sensor disposed between the first and second magnets, wherein the magnetic field sensor comprises an electronic circuit. The electronic circuit can include one or more of the following:

a substrate having a major surface disposed in an x-y plane, wherein the line between centers of the north and south magnetic poles of the first magnet is perpendicular to the x-y plane;

first, second, third, and fourth magnetic field sensing elements disposed upon the major surface of the substrate and configured to generate first, second, third and fourth respective electronic magnetic field signals, wherein each electronic magnetic field signal is responsive to a respective magnetic field parallel to the major surface of the substrate, wherein the first and third magnetic field sensing elements have respective first and third maximum response axes parallel to each other, directed in opposite directions, and parallel the major surface of the substrate, and wherein the second and fourth magnetic field sensing elements have respective second and fourth maximum response axes parallel to each other, directed in opposite directions, and parallel the major surface of the substrate, wherein the first and third major response axes are not parallel to the second and fourth major response axes;

generating a first difference signal related to a difference between the first and third electronic magnetic field signals; or generating a second difference signal related to a difference between the second and fourth electronic magnetic field signals, wherein the first difference signal has an amplitude related to an x-axis projection upon the x-y plane and the second difference signal has an amplitude related to a y-axis projection upon the x-y plane.

In accordance with an example useful for understanding another aspect of the present invention, a magnetic field sensor can include an electronic circuit. The electronic circuit can include one or more of the following:

a substrate having a major surface disposed in an x-y plane;

a plurality of magnetic field sensing elements disposed upon the major surface of the substrate and configured to generate a respective plurality of electronic magnetic field signals, wherein each electronic magnetic field signal is responsive to a respective magnetic field parallel to the major surface of the substrate, wherein the plurality of magnetic field sensing elements have respective maximum response axes directed in different directions and parallel to the major surface of the substrate;

a processor coupled to the plurality of magnetic field sensing elements and configured to generate a first signal and a second signal, wherein the first signal has an amplitude related to an x-axis projection upon the x-y plane and the second signal has an amplitude related to a y-axis projection upon the x-y plane; or a magnet disposed at a fixed relationship and proximate to the substrate, wherein the magnet has a north pole and a south pole, a line between which is perpendicular to the major surface of the substrate, wherein a magnetic force of the magnet results in a restoring force upon a shaft.

In accordance with an example useful for understanding another aspect of the present invention, a magnetic assembly can include one or more of the following:

a first magnet having north and south magnetic poles;

a second magnet having north and south magnetic poles;

a movable shaft fixedly coupled to the second magnet such that movement of the movable shaft results in movement of the second magnet relative to the first magnet such that a line between centers of the north and south magnetic poles of the second magnet is movable relative to a line between the north and south magnetic poles of the first magnet, wherein an attraction of the second magnet to the first magnet result in a restoring force upon the shaft; or a magnetic field sensor disposed between the first and second magnets, wherein the magnetic field sensor comprises an electronic circuit. The electronic circuit can include one or more of the following.

a substrate having a major surface disposed in an x-y plane, wherein the line between centers of the north and south magnetic poles of the first magnet is perpendicular to the x-y plane;

a plurality of magnetic field sensing elements disposed upon the major surface of the substrate and configured to generate a respective plurality of electronic magnetic field signals, wherein each electronic magnetic field signal is responsive to a respective magnetic field parallel to the major surface of the substrate, wherein the plurality of magnetic field sensing elements have respective maximum response axes directed in different directions and parallel to the major surface of the substrate; or a processor coupled to the plurality of magnetic field sensing elements and configured to generate a first signal and a second signal, wherein the first signal has an amplitude related to an x-axis projection upon the x-y plane and the second signal has an amplitude related to a y-axis projection upon the x-y plane.

In accordance with an example useful for understanding another aspect of the present invention, a method of sensing a position of a magnet can include one or more of the following:

providing, upon a substrate, a plurality of magnetic field sensing elements disposed upon the major surface of the substrate and configured to generate a respective plurality of electronic magnetic field signals, wherein each electronic magnetic field signal is responsive to a respective magnetic field parallel to the major surface of the substrate, wherein the plurality of magnetic field sensing elements have respective maximum response axes directed in different directions and parallel to the major surface of the substrate;

generating a first signal and a second signal, wherein the first signal has an amplitude related to an x-axis projection upon the x-y plane and the second signal has an amplitude related to a y-axis projection upon the x-y plane; or providing a magnet disposed at a fixed relationship and proximate to the substrate, wherein the magnet has a north pole and a south pole, a line between which is perpendicular to the major surface of the substrate, wherein a magnetic force of the magnet results in a restoring force upon a shaft.

In accordance with an example useful for understanding another aspect of the present invention, a method of sensing a position of a magnet can include one or more of the following:

providing a first magnet having north and south magnetic poles;

providing a second magnet having north and south magnetic poles;

providing a movable shaft fixedly coupled to the second magnet such that movement of the movable shaft results in movement of the second magnet relative to the first magnet such that a line between centers of the north and south magnetic poles of the second magnet is movable relative to a line between the north and south magnetic poles of the first magnet, wherein an attraction of the second magnet to the first magnet result in a restoring force upon the shaft; or providing a magnetic field sensor disposed between the first and second magnets, wherein the magnetic field sensor comprises an electronic circuit. The electronic circuit can include one or more of the following:

a substrate having a major surface disposed in an x-y plane, wherein the line between centers of the north and south magnetic poles of the first magnet is perpendicular to the x-y plane; or a plurality of magnetic field sensing elements disposed upon the major surface of the substrate and configured to generate a respective plurality of electronic magnetic field signals, wherein each electronic magnetic field signal is responsive to a respective magnetic field parallel to the major surface of the substrate, wherein the plurality of magnetic field sensing elements have respective maximum response axes directed in different directions and parallel to the major surface of the substrate. The method can also include:

generating a first signal and a second signal, wherein the first signal has an amplitude related to an x-axis projection upon the x-y plane and the second signal has an amplitude related to a y-axis projection upon the x-y plane.

BRIEF DESCRIPTION OF THE DRAWINGS

The foregoing features of the invention, as well as the invention itself may be more fully understood from the following detailed description of the drawings, in which:

FIG. 1 is a side view showing a magnetic assembly having first and second magnets and an electronic substrate disposed between the first and second magnets;

FIG. 2 is a top view of the magnetic assembly of FIG. 1;

DETAILED DESCRIPTION

Figures 3, 4:
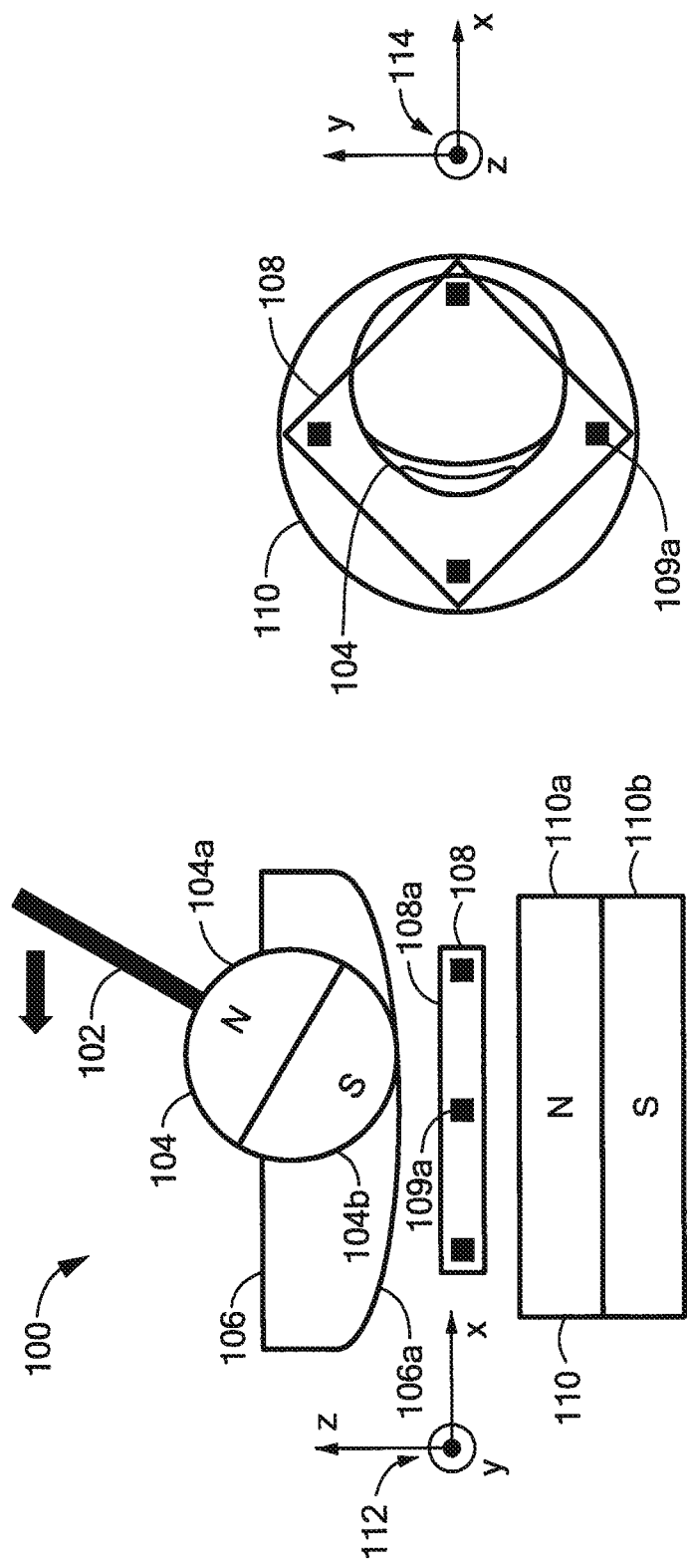
FIG. 3 is a side view showing the magnetic assembly of FIG. 1 with a change of position of the second magnet.
FIG. 4 is a top view of the magnetic assembly of FIG. 3.

Before describing the present invention, it should be noted that reference is sometimes made herein to magnetic assemblies having magnetic components with particular shapes (e.g., spherical). One of ordinary skill in the art will appreciate, however, that the techniques described herein are applicable to a variety of sizes and shapes.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

While specific reference is made below to magnetic field sensing elements that have maximum response axes that are parallel to a surface of an electronic substrate, it should be recognized that other magnetic field sensing elements with magnetic maximum response axes in other directions may be used.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital.

As used herein, the term "module" is used to describe a "processor."

A processor can contain internal processors or internal modules that perform portions of the function, operation, or sequence of operations of the processor. Similarly, a module can contain internal processors or internal modules that perform portions of the function, operation, or sequence of operations of the module.

While electronic circuit shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures, but should be understood.

As used herein, the term "predetermined," when referring to a value or signal, is used to refer to a value or signal that is set, or fixed, in the factory at the time of manufacture. As used herein, the term "determined," when referring to a value or signal, is used to refer to a value or signal that is identified by a circuit during operation, after manufacture.

As used herein, the term "active electronic component" is used to describe and electronic component that has at least one p-n junction. A transistor, a diode, and a logic gate are examples of active electronic components. In contrast, as used herein, the term "passive electronic component" as used to describe an electronic component that does not have at least one p-n junction. A capacitor and a resistor are examples of passive electronic components.

Referring to FIG. 1, an example of a magnetic assembly 100 includes a first magnet 110, a second magnet 104, and an electronic substrate 108 disposed between the first magnet 110 and the second magnet 104. A shaft 102 can be rigidly or fixedly coupled to the second magnet 104 so that, if the shaft 102 is moved, the second magnet 104 also experiences movement. The second magnet 104 is shown here in a zero or resting position.

The magnetic assembly 100 will be recognized to have characteristics representative of a joystick, wherein the shaft 102 is indicative of a shaft that can be moved by a user. However, other applications are possible other than joysticks, and while joysticks are mentioned explicitly herein, it will be understood that movement of position of the second magnet 104 and other magnets described below can be detected by electronic circuits described herein, when used in other applications, which may or may not have a shaft.

The electronic substrate 108 can include a plurality of magnetic field sensing elements, e.g. a magnetic field sensing element 108a.

The shaft 102 and the second magnet 104 attached thereto, are subject to movement, which is detected by the magnetic field sensing elements upon the electronic substrate 108 in ways described more fully below.

The electronic substrate 108 has a major planar surface 108a. This first magnet 110 has a north pole 110a and a south pole 110b, a line between which is substantially perpendicular to the major planar surface 108a of the electronic substrate 108.

The second magnet 104 has a north pole 104a and a south pole 104b, a line between which is substantially perpendicular to the major planar surface 108a of the electronic substrate 108 when the second magnet 104 is at the zero resting position.

The first and second magnets 110, 104, respectively, have a magnetic force therebetween, resulting in a restoring force upon the second magnet 104, such that the second magnet 104 will achieve the position shown when no other force is applied to the second magnet 104.

In this position, it will be appreciated that in a region between the first magnet 110 and the second magnet 104, magnetic flux lines pass through the electronic substrate 108 in a direction substantially perpendicular to the major planar surface 108a of the electronic substrate 108.

In some embodiments, the second magnet 104 can be disposed in a cavity 106 having a cavity surface 106a. The cavity surface 106a can be curved or flat. In some embodiments, the second magnet 104 is substantially spherical.

In some embodiments, the electronic substrate 108 is part of a magnetic field sensor that includes not only the magnetic field sensing elements, e.g., 109a, upon the electronic substrate 108, but also other electronics, including active and/or passive electronic components. Some types of magnetic field sensors are shown in FIGS. 13 and 16-19. In some embodiments, the first magnet 110 forms a part of a magnetic field sensor.

The substrate 108 is shown to be larger than the second magnet 104. However, typically, the substrate 108 is smaller than the magnet 104 (here and in figures below).

In some embodiments, the second magnet 104 has a spherical shape with a diameter of about 0.25 inches. In some embodiments, the first magnet 110 is a solid cylinder with a diameter of about 0.25 inches and a thickness of about 0.125 inches.

Coordinate axes 112 are used here and in figures below to show a common reference frame.

Referring now to FIG. 2, in which like elements of FIG. 1 are shown having like reference designations, the electronic substrate 108 is shown to have first, second, third, and fourth magnetic field sensing elements 108a, 108b, 108c, 108d, respectively. In some embodiments, the four magnetic field sensing elements 108a, 108b, 108c, 108d are disposed at corners of the square, such that a line between the first and third magnetic field sensing elements 108a, 108c, respectively, and a line between the second and fourth magnetic field sensing elements 108b, 108d are perpendicular to each other. However, other angles are also possible.

The first magnetic field sensing element 108a has a directional maximum response axis 116, the second magnetic field sensing element 108b as a directional maximum response axis 118, the third magnetic field sensing element 108c has a maximum response axis 120, and the fourth magnetic field sensing element 108d has a directional maximum response axis 122.

In some embodiments, the four directional response axes 116, 118, 120, 122 can be parallel to the major planar surface 108a of the electronic substrate 108.

In some embodiments, the directional response axes 116, 120 can be parallel to each other but in opposite directions. Also, the directional response axes 118, 122 can be parallel to each other but in opposite directions.

In some embodiments, the directional axes 116, 120 can be perpendicular to the directional axes 118, 122. However, other angles are also possible.

Maximum response axes are not shown in figures below, however, it will be understood that a similar maximum response axes apply to the various figures below.

In some embodiments, the arrangement of magnetic field sensing elements is in a square, e.g., the substrate 108, with sides about 1.14 mm long. However, the substrate 108 can be larger or smaller. The square shape of the substrate 108 can be representative of the substrate, or instead representative of the arrangement of the magnetic field sensing elements 109a, 109b, 109c, 109d, in which case, the substrate can be larger than the square shape shown.

Coordinate axes 114, shown here and in figures below, show the same reference frame as the coordinate axes 112 of FIG. 1.

Referring to FIG. 3, in which like elements of FIG. 1 are shown having like reference designations, the second magnet 104 has been rotated, for example by a user applying a force upon a shaft 102, and there is a restoring force represented by an arrow. If the user were to release the shaft, the second magnet 104 would return to its position shown above in conjunction with FIG. 1.

It should be recognized that rotation of the second magnet can cause the second magnet 104 to move laterally along the surface 106a of the cavity 106.

Referring now to FIG. 4, in a top view, in which like elements of FIG. 1 are shown having like reference designations, it can be seen that the second magnet 104 has moved laterally relative to the electronic substrate 108 and to the first magnet 110. The first magnet 110 can be stationary relative to the electronic substrate 108.

Lateral movement of the second magnet 104 may not be desirable.

Figure 5:
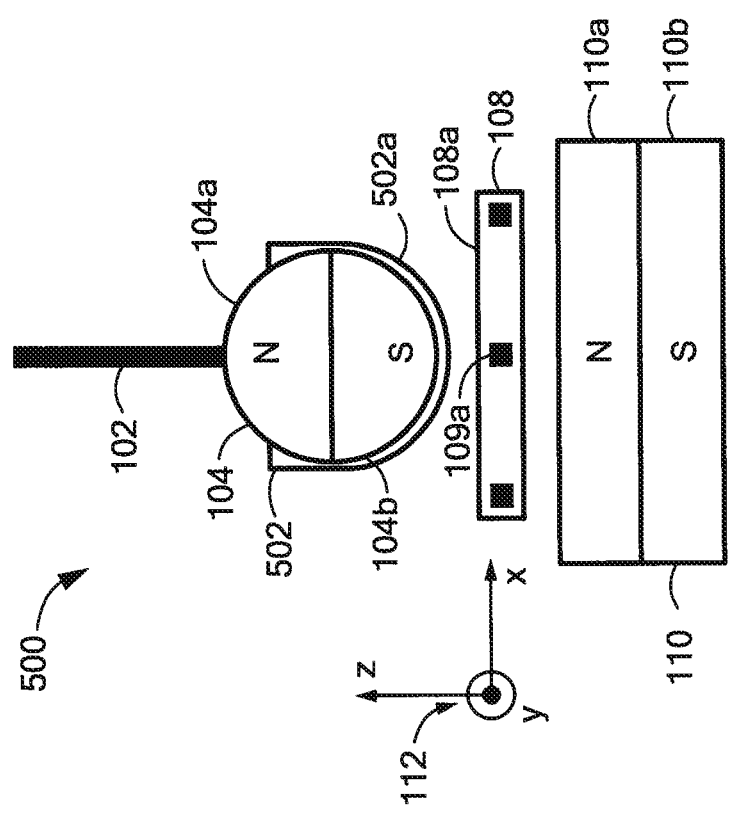
FIG. 5 is a side view showing yet another magnetic assembly having first and second magnets and an electronic substrate disposed between the first and second magnets.

Referring now to FIG. 5, in which like elements of FIG. 1 are shown having like reference designations, another magnetic assembly 500 is like the magnetic assembly 100 of FIG. 1, however, a different cavity 502 having a different cavity surface 502a is used.

The cavity 502 allows the second magnet 104 to rotate, but keeps the second magnet in place and not able to move laterally.

Figure 6:
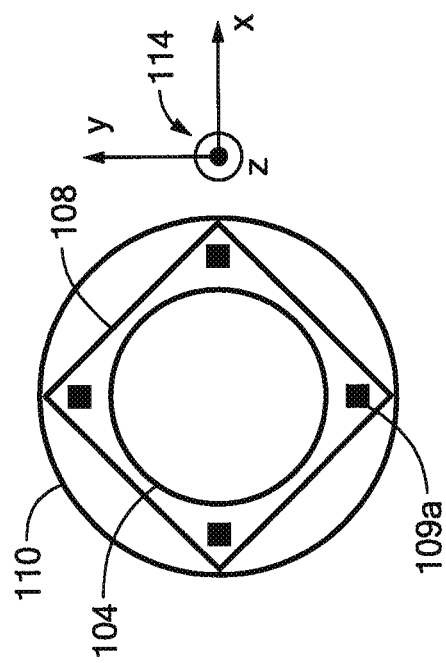
FIG. 6 is a top view of the magnetic assembly of FIG. 5.

Referring now to FIG. 6, in a top view, in which like elements of FIG. 1 are shown having like reference designations, the second magnet 104 is substantially centered with the four magnetic field sensing elements.

Figures 7, 8:
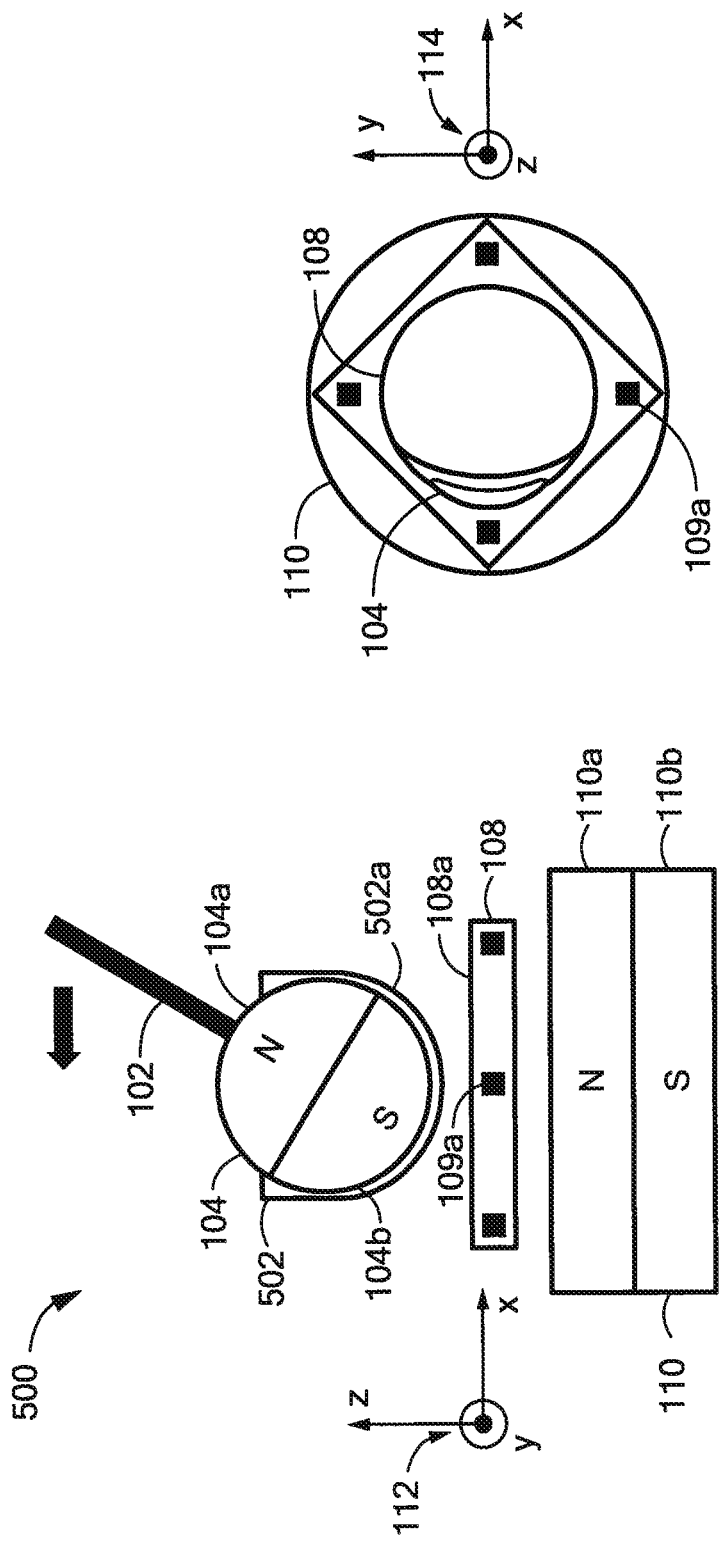
FIG. 7 is a side view showing the magnetic assembly of FIG. 5 with a change of position of the second magnet.
FIG. 8 is a top view of the magnetic assembly of FIG. 7.

Referring now to FIG. 7, in which like elements of FIG. 1 are shown having like reference designations, the magnetic assembly 500 is shown again where the second magnet 104 has been rotated, for example, by a force applied by user upon a shaft 102. A restoring force, described above in conjunction with FIG. 3, is represented by an arrow.

Referring now to FIG. 8, in a top view, in which like elements of FIG. 1 are shown having like reference designations, even though the second magnet 104 is rotated, the second magnet 104 substantially centered with the four magnetic field sensing elements.

Figure 9:
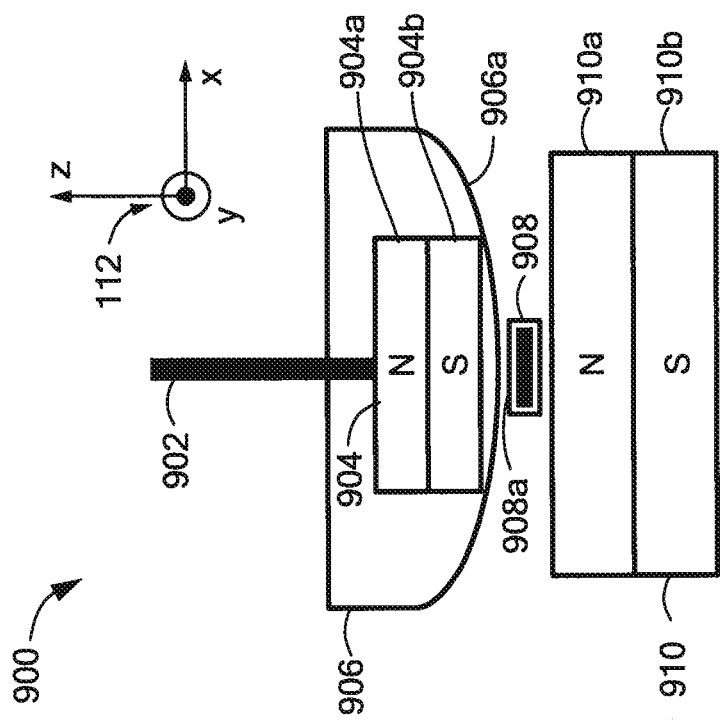
FIG. 9 is a side view showing yet another magnetic assembly having first and second magnets and an electronic substrate disposed between the first and second magnets.

Referring now to FIG. 9, another example of a magnetic assembly 900 includes a first magnet 910, a second magnet 904, and an electronic substrate 908 disposed between the first magnet 910 and the second magnet 904. A shaft 902 is rigidly or fixedly coupled to the second magnet 904 so that, if the shaft 902 is moved, the second magnet 904 also experiences movement. The second magnet 904 is shown here in a zero or resting position.

The magnetic assembly 900 will be recognized to have characteristics representative of a joystick, wherein the shaft 902 is indicative of a shaft that can be moved by a user. However, other applications are possible other than joysticks, and while joysticks are mentioned explicitly herein, it will be understood that movement of position of the second magnet 904 and other magnets described below can be detected by electronic circuits described herein, when used in other applications.

The electronic substrate 908 can include a plurality of magnetic field sensing elements.

The shaft 902, and the second magnet 904 attached thereto, are subject to movement, which is detected by the magnetic field sensing elements upon the electronic substrate 908 in ways described more fully below.

The electronic substrate 908 has a major planar surface 908a. This first magnet 910 has a north pole 910a and a south pole 910b, a line between which is substantially perpendicular to the major planar surface 908a of the electronic substrate 908.

The second magnet 904 has a north pole 904a and a south pole 904b, a line between which is substantially perpendicular to the major planar surface 908a of the electronic substrate 908 when the second magnet 904 is at the zero resting position.

The first and second magnets 910, 904, respectively, have a magnetic force therebetween, resulting in a restoring force upon the second magnet 904, such that the second magnet 904 will achieve the position shown when no other force is applied to the second magnet 904.

In this position, it will be appreciated that in a region between the first magnet 910 and the second magnet 904, magnetic flux lines pass through the electronic substrate 908 in a direction substantially perpendicular to the major planar surface 908a of the electronic substrate 108.

In some embodiments, the second magnet 904 can be disposed in a cavity 906 having a cavity surface 906a. The cavity surface 908a can be curved or flat.

In some embodiments, the second magnet 904 is substantially cylindrical, with or without a void center part.

In some embodiments, the electronic substrate 908 is part of a magnetic field sensor that includes not only the magnetic field sensing elements, e.g., 109a, upon the electronic substrate 108, but also other electronics, including active and/or passive electronic components. Some types of magnetic field sensors are shown in FIGS. 13 and 16-19. In some embodiments, the first magnet 110 forms a part of a magnetic field sensor.

In some embodiments, the arrangement of magnetic field sensing elements is in a square, e.g., the substrate 908, with sides about 1.14 mm long. However, the substrate 908 can be larger or smaller. The square shape of the substrate 908 can be representative of the substrate, or instead representative of the arrangement of the magnetic field sensing elements, e.g., 909a, in which case, the substrate can be larger than the square shape shown.

In some embodiments, the second magnet 904 has a cylindrical shape with a diameter of about 0.25 inches and a thickness of about 0.125 inches. In some embodiments, the second magnet 904 is an open cylinder with an internal diameter of about 0.125 inches.

In some embodiments, the first magnet 910 has a cylindrical shape with a diameter of about 0.25 inches and a thickness of about 0.125 inches. In some embodiments, the first magnet 910 is an open cylinder with an internal diameter of about 0.125 inches.

Coordinate axes 112 are the same as coordinate axes 112 in figures above.

Figure 10:
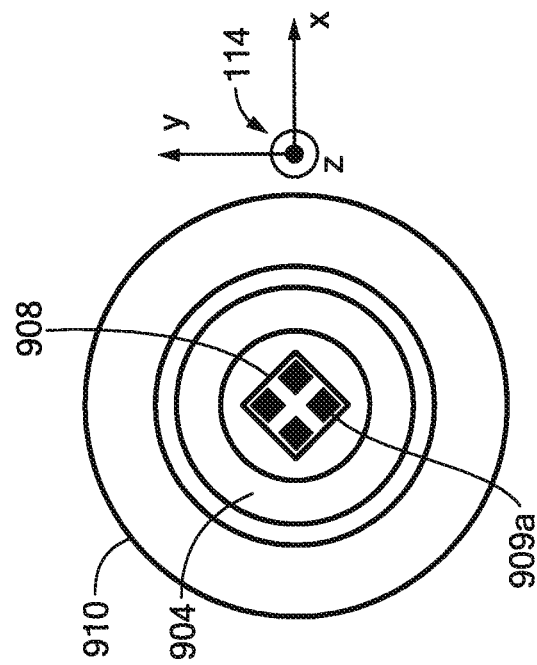
FIG. 10 is a top view of the magnetic assembly of FIG. 9.

Referring now to FIG. 10, in which like elements of FIG. 9 are shown having like reference designations, the electronic substrate 908 is shown to have four magnetic field sensing elements, e.g., 909a. As described above in conjunction with FIG. 2, in some embodiments, the four magnetic field sensing elements are disposed at corners of the square, such that a line between opposite ones of the four magnetic field sensing elements and a line between other opposite ones of the four magnetic field sensing elements are perpendicular to each other. However, other angles are also possible.

Directional maximum response axes and orientations thereof can be the same as or similar to those described above in conjunction with FIG. 2.

Coordinate axes 114 are the same as coordinate axes 114 in figures above.

Here; the second magnet 904 has a center void, such that the second magnet 904 is in the form of a cylindrical ring. In some embodiments, the first magnet 910 is also in the form of a cylindrical ring. However, in other embodiments, either one of, or both of, the magnets can be in the form of solid cylinders.

Figure 11:
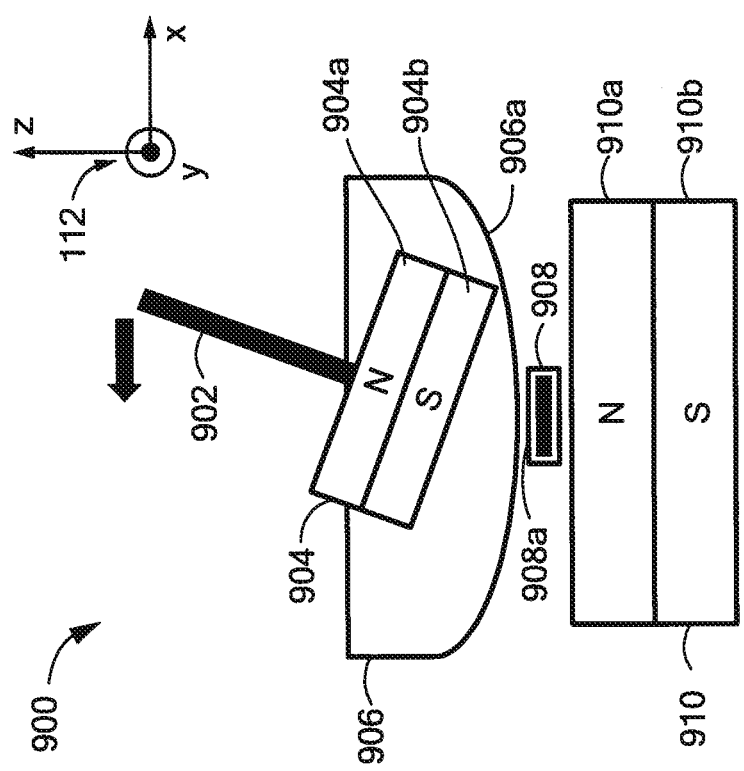
FIG. 11 is a side view showing the magnetic assembly of FIG. 9 with a change of position of the second magnet.

Referring to FIG. 11, in which like elements of FIG. 9 are shown having like reference designations, the second magnet 904 has been rotated, for example by a user applying a force upon a shaft 902. A restoring force, described above in conjunction with FIG. 3, is represented by an arrow. If the user were to release the shaft, the second magnet 904 would return to its position shown above in conjunction with FIG. 9.

It should be recognized that rotation of the second magnet 904 causes the second magnet to move laterally along the surface 906a of the cavity 906.

Figure 12:
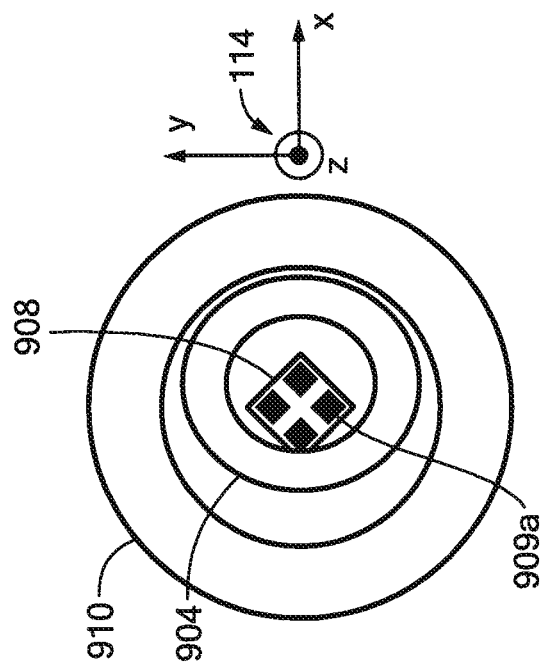
FIG. 12 is a top view of the magnetic assembly of FIG. 11.

Referring now to FIG. 12, in a top view, in which like elements of FIG. 9 are shown having like reference designations, it can be seen that the second magnet 904 has moved laterally relative to the electronic substrate 908 and relative to the first magnet 910.

Lateral movement of the second magnet 904 may not be desirable. The first magnet 910 can be stationary relative to the electronic substrate 908.

Figure 13:
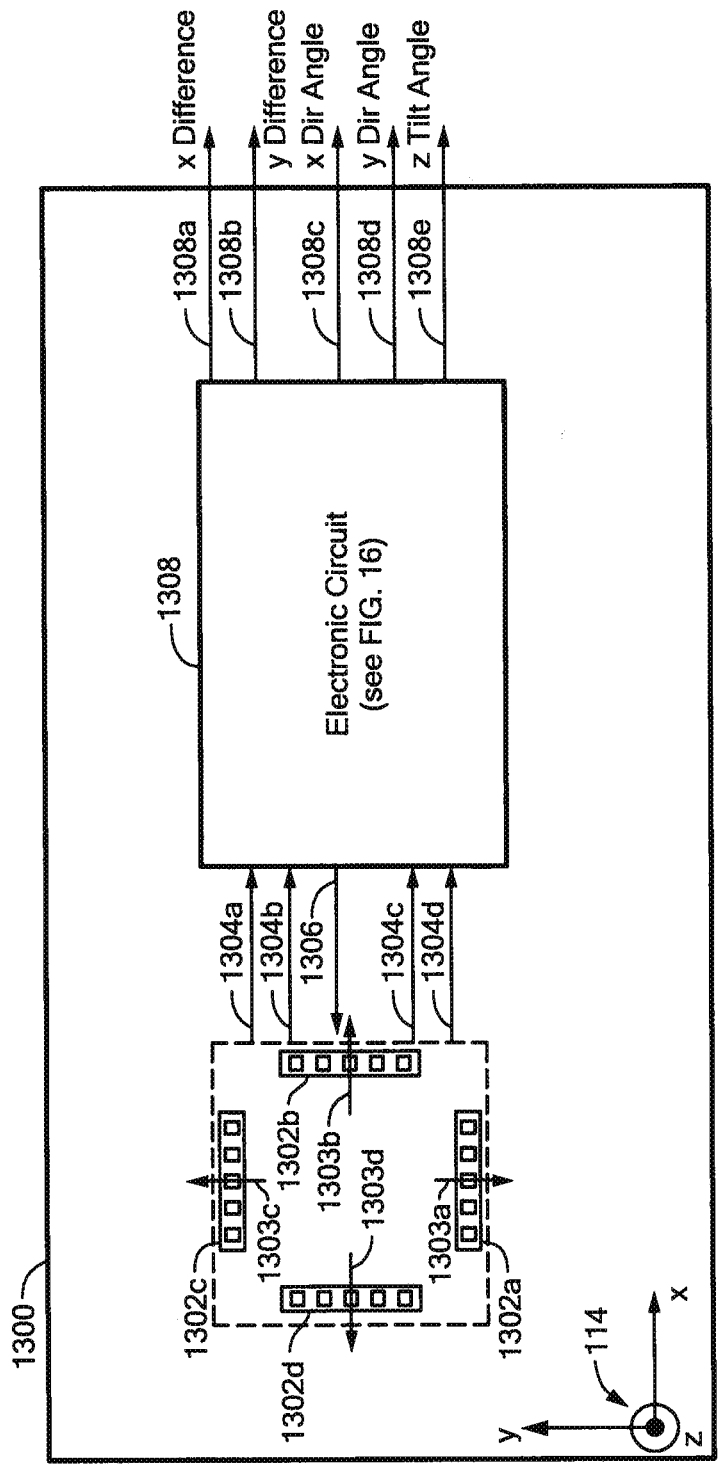
FIG. 13 is a top view of an electronic substrate having four magnetic field sensing elements and an electronic circuit that can be used as one of the above-mentioned electronic substrates.

Referring now to FIG. 13, an electronic substrate 1300 can be the same as or similar to the electronic substrates 108, 908 described above. Upon the electronic substrate 1300 can be disposed first, second, third, and fourth magnetic field sensing elements 1302a, 1302b, 1302c, 1302d, respectively.

The first, second, third, and fourth magnetic field sensing elements 1302a, 1302b, 1302c, 1302d are shown in a form more representative of vertical Hall elements. As is known, a typical vertical Hall element has vertical Hall element contacts, e.g., five vertical Hall element contacts as shown by small boxes, arranged in a row. In operation, a current is passed between some of the contacts, and a differential voltage output signal is generated at two of the contacts. A polarity, i.e., a direction of a directional maximum response axis, can be switched merely by switching the two contacts at which the differential output voltage is generated.

Accordingly, the first, second, third, and fourth magnetic field sensing elements 1302a, 1302b, 1302c, 1302d have respective first, second, third, and fourth directional maximum response axes 1303a, 1303b, 1303c, 1303d, respectively. The directional maximum response axes 1303a, 1303b, 1303c, 1303d have the same characteristics as the direction maximum response axes 116, 118, 120, 122 of FIG. 2.

Current spinning or chopping is a known technique used to reduce DC offset voltage (i.e., residual DC voltage when in the presence of zero magnetic field) of a Hall element. Current spinning can be used for both planar (horizontal) and vertical Hall elements. With current spinning, Hall element contacts that are driven and Hall element contacts at which a differential output voltage is generated, are changed, or switched at a chopping rate. For each change of the connections, the Hall element tends to generate a different offset voltage. When the different DC output voltages are taken together, i.e., averaged, the net DC offset voltage is greatly reduced.

The first, second, third, and fourth magnetic field sensing elements 1302a, 1302b, 1302c, 1302d can generate a respective first, second, third, and fourth electronic magnetic field signals 1304a, 1304b, 1304c, 1304d, respectively. In some embodiments, the first, second, third, and fourth electronic magnetic field signals 1304a, 1304b, 1304c, 1304d are differential signals, but are here shown as individual connections.

An electronic circuit 1308 can be coupled to receive the first, second, third, and fourth magnetic field signals 1304a, 1304b, 1304c, 1304d, respectively. The electronic circuit 1308 can also be configured to generate one or more drive signals 1306 that can drive the magnetic field sensing elements 1302a, 1302b, 1302c, 1302d.

Angles (e.g., of the shaft 102 of FIG. 3) projected in the x-y plane are referred to herein as direction angles. A direction angle can be an x direction angle relative to the x-axis, or a y direction angle relative the x-axis. Angles (e.g., of the shaft 102 of FIG. 3) relative to the z-axis are referred to herein as tilt angles.

The electronic circuit 1308 is configured to generate one or more output signals, which can include, but which are not limited to, an x difference signal 1308a representative of, for example, a projection of the shaft 102 of FIG. 3 upon the x-axis of the x-y plane, output y difference signal 1308b representative of, for example, a projection of the shaft 102 of FIG. 3 upon the y-axis of the x-y plane, an x direction angle signal 1308c representative of, for example, an angle between a projection of the shaft 102 of FIG. 3 in the x-y plane and the x-axis, a y direction angle signal 1308d is representative of, for example, an angle between a projection of the shaft 102 of FIG. 3 the x-y plane and the y-axis, or a tilt angle signal 1308e representative of, for example, a z tilt angle of the shaft 102 of FIG. 3 relative to the z-axis perpendicular to the x-y plane. The electronic circuit 1308 is described more fully below in conjunction with FIG. 16.

In some embodiments, the first, second, third, and fourth magnetic field sensing elements 1302a, 1302b, 1302c, 1302d, respectively, here shown to be vertical Hall elements, can instead be magnetoresistance elements. Magnetoresistance elements are not used with current spinning or chopping.

Magnetoresistance elements can be formed in a variety of shapes when viewed from the top. For example, in some embodiments magnetoresistance elements can be formed in a bar shape wherein the directional maximum response axis is perpendicular to the longest axis of the bar. In other embodiments, the magnetoresistance elements can be formed in a yoke shape having a longest side and the maximum response axis can be perpendicular to the length of the longest side.

Figure 14:
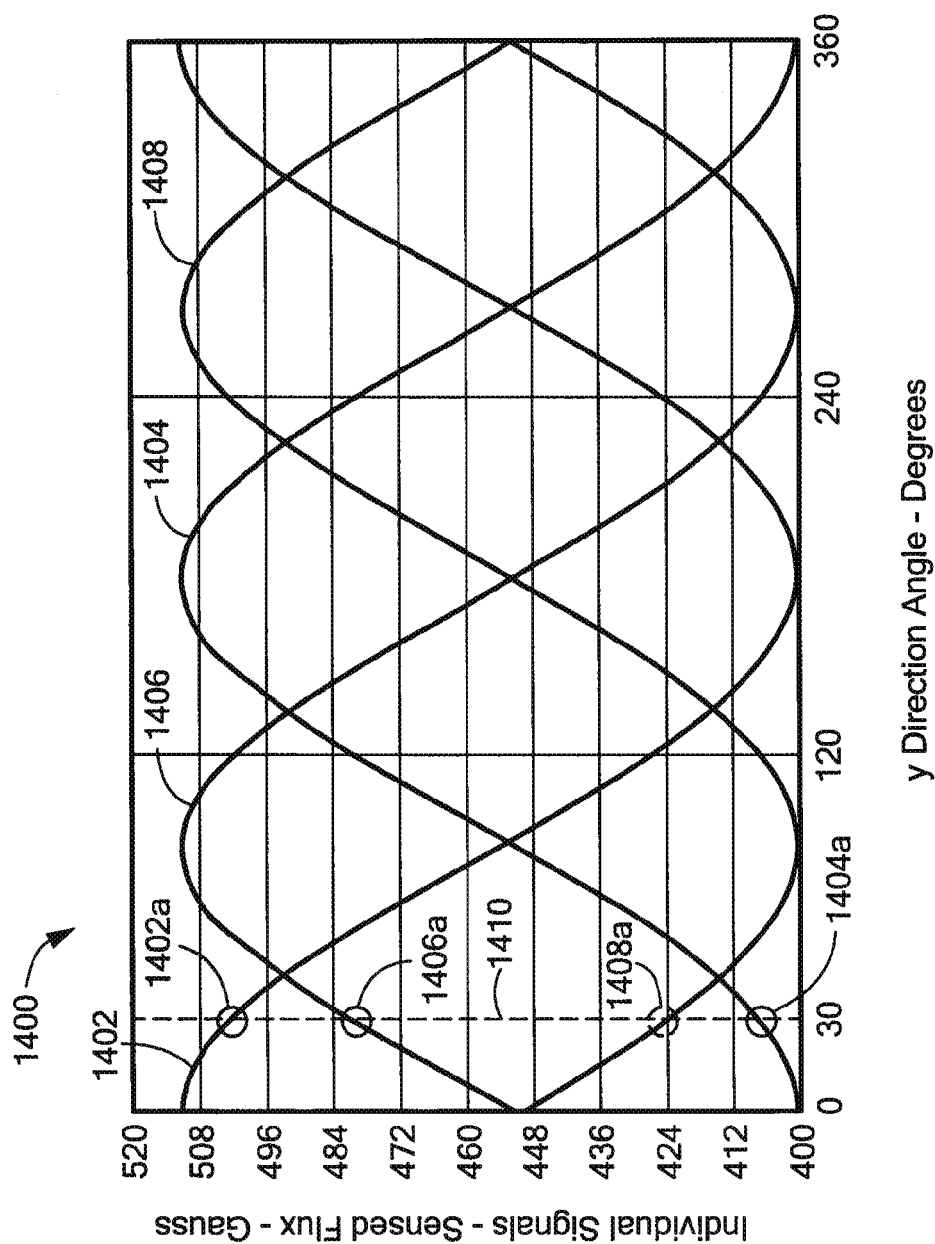
FIG. 14 is a graph showing four signals that can be generated by the four magnetic field sensing elements of FIG. 13.

Referring now to FIG. 14, a graph 1400 has a horizontal axis in with a scale in units of degrees. Degrees are indicative of a projected y direction angle of the shaft 102 of FIG. 3 in the x-y plane relative to the y-axis as the shaft is moved in a circle about its zero position, i.e., around the z-axis. The graph 1400 also has a vertical axis with a scale in units of a sensed magnetic field in Gauss, as sensed by the four magnetic field sensing elements of figures herein.

A signal 1402 is representative of an output signal from one of the magnetic field sensing elements most sensitive to magnetic field parallel to the y-axis, for example, the magnetic field sensing element 109a of FIG. 2, as the shaft 102 of FIG. 3 is moved in a circle around the z-axis, (i.e., to different direction angles but at a fixed tilt angle). A signal 1404 is representative of an output signal from an opposite one of the magnetic field sensing elements, sensitive to magnetic field parallel to the y-axis, for example, the magnetic field sensing element 109c of FIG. 2. Signals 1402 and 1404 are one hundred eighty degrees apart.

A signal 1406 is representative of an output signal from one of the magnetic field sensing elements sensitive to magnetic field parallel to the x-axis, for example, the magnetic field sensing element 109b of FIG. 2, as the shaft 102 of FIG. 3 is moved in a circle around the z-axis, (i.e., to different direction angles but at a fixed tilt angle). A signal 1408 is representative of an output signal from an opposite one of the magnetic field sensing elements sensitive to magnetic field parallel to the x-axis, for example, the magnetic field sensing element 109d of FIG. 2. Signals 1406 and 1408 are one hundred eighty degrees apart.

It can be seen that, different ones of the signals 1402, 1404, 1406, 1408 achieve positive maximum values at different direction angles, i.e., as the shaft 102 of FIG. 3 points toward different ones of the magnetic field sensing elements 109a, 109b, 109c, 109d.

It should be appreciated that an absolute amplitude of the signals 1402, 1404, 1406, 1408 is dependent upon the tilt angle of the shaft 102 relative to the z-axis. The amplitudes can be greater for greater tilt angles relative to the z-axis. However, the phase relationships (and ratios of signals for any projected y direction angle) remain the same.

The indicated phase relationships are indicative of four magnetic field sensing elements having orthogonal maximum response axes. However, in other embodiments, other relationships between directions of the maximum response axes can result in other phase relationships of the signals 1402, 1404, 1406, 1408. For example, in conjunction with the arrangement of FIGS. 20 and 21 having three magnetic field sensing elements spaced one hundred twenty degrees apart results in three sinusoids that are one hundred twenty degrees apart in phase.

Circuits described in further detail below can, in some embodiments, take difference measurements between pairs of the signals 1402, 1404, 1406, 1408. Values 1402a, 1404a, 1406a, 1408a are representative of a thirty degree y direction angle relative to the y-axis, (i.e., projected angle in the x-y plane relative to the y-axis) and also a twenty degree z tilt angle (i.e., angle over and relative to the x-y plane).

It is desirable that the magnetic field sensing elements described herein have maximum response axes in the x and y directions. In some embodiments, circuits described in further detail below take difference measurements between pairs of the signals 1402, 1404, 1406, 1408, for example a difference of values 1402a and 1404a referred to herein as a y difference signal, and a difference of values 1406a and 1408a, referred to herein as an x difference signal. Difference measurements allow for rejections of effects that may result from the large magnetic fields between the first and second magnets that are directed along the z-axis.

As indicated above, it should be understood that, for larger z tilt angles relative to the z-axis, the signals 1402, 1404, 1406, 1408 are larger, and the y difference signal and x difference are signal also larger.

Figure 15:
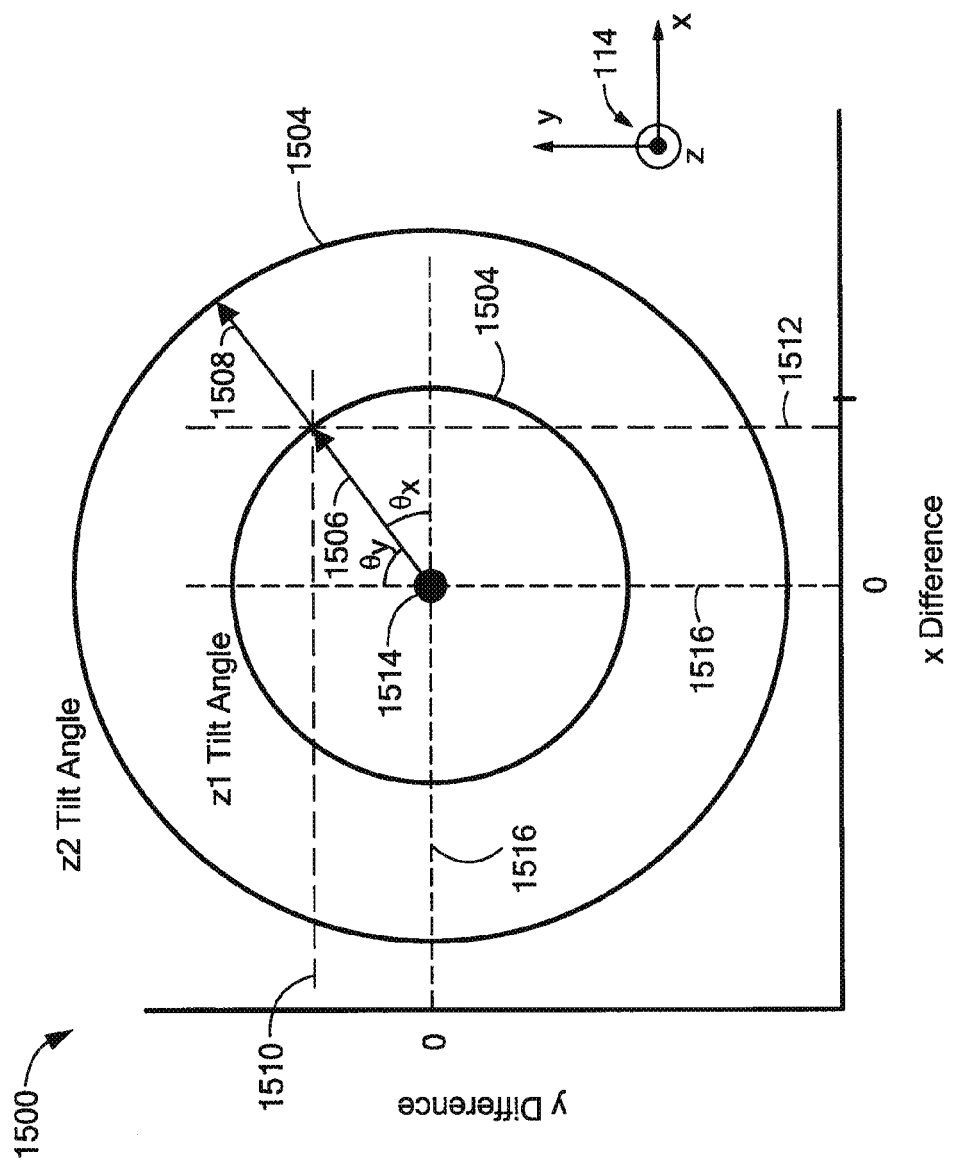
FIG. 15 is a graph representative of signal that can be generated by the electronic circuit of FIG. 13

Referring now to FIG. 15, a graph 1500 has a horizontal axis with a scale in arbitrary unit indicative of an x difference signal, for example, a difference of the signals 1406, 1408 of FIG. 14. The graph 1500 also has a vertical axis with a scale in arbitrary units indicative of a y difference signal, for example, a difference of the signals 1402, 1404 of FIG. 14.

An arrow 1506 is representative of a top view looking down on any of magnetic assemblies above, for example, looking down at the shaft 102 of the figures above. The arrow is representative of a projection upon the x-y plane.

Direction angles θx and θy are shown. A z tilt angle θz comes out of the page.

It should be apparent that by knowing a value 1512 of an x difference signal and a value 1510 of a y difference signal, the direction angles θx and θy of the arrow 1506 in the x-y plane can be determined, for example by:

$$x \text{ direction angle} = \theta x = \arctan(x/y), \quad (1)$$

where:
x=value of the x difference signal, and
y=value of the y difference signal.

$$y \text{ direction angle} = \theta y = \arctan(y/x), \quad (2)$$

It should also be apparent that the length of the arrow 1506 can change, for example, to an arrow 1508, for different z tilt angles of the shaft 102 of figures above relative to the z-axis. The different z tilt angle can result in a different value of the x difference signal and a different value of the y difference signal, but the same ratio of the values when the pointing angle (in the x-y plane) remains the same.

It should also be apparent that the z tilt angle (relative to the z-axis) can also be computed by knowing the value (e.g., 1512) of the x difference signal and the value (e.g., 1510) of the y difference signal. For example, the two values can be used to identify a length of the projected arrow, e.g., 1506, or 1508. In essence, the length of the arrow 1506 or 1508 (a projection upon the x-y plane) is proportional to the z tilt angle.

In some embodiments, the length of the projected arrow can be computed by:

$$L = \text{sqrt}(x^2 + y^2), \quad (3)$$

where:
L=length of projected arrow,
x=value of the x difference signal, and
y=value of the y difference signal.

It should be appreciated that the length, L, of the arrow can vary in a way that is not only related to tilt angle. For example, if the shaft 102 of FIG. 1 does not pivot about a fixed point, another geometric relationship can be related to the length, L. However, the other geometric relationship may be known, and thus, it may still be possible to establish a tilt angle using calibrations described below, in combination with the known geometric relationship.

In some embodiments, in order to identify the z tilt angle from the computed length, L, of the arrow (e.g., 1506 or 1508), a calibration is performed. For example, taking the magnetic assembly of FIGS. 1-4, the shaft 102 can be tilted to a maximum possible tilt angle θztiltmax, which is limited by mechanical considerations, to a known maximum angle. A maximum length of the projected arrow, Lmax, (projected into the x-y plane), i.e., a maximum diameter of a circle, e.g., 1502, 1504, can be computed by equation (3) above.

Knowing Lmax, and corresponding maximum tilt angle θtiltmax, then other tilt angle can be identified as follows:

$$\tan(\theta z \text{tiltmax}) = L \text{max}/K, \quad (4)$$

where:
θztiltmax=maximum z tilt angle,
Lmax=maximum length of the projection onto the x-y plane, and
K=a constant (equivalent to a constant unprojected length of the arrow).

$$\theta z = \arctan(L/K), \quad (5)$$

where:
θz=z tilt angle
K=constant computed by equation (4), and
L=length of projected arrow computed by equation (3).

In other embodiments, a predetermined value is used for the above constant K, and there is no calibration. Equation 5 can be used to compute the z tilt angle using the predetermined constant K.

In other embodiments, the value, K, is not constant, but can be measured at a variety of projected arrows, L, in which case, the z tilt angle, θz, can be interpolated using the variety of K and L values.

In other embodiments, an algorithm can be used to compute K in relation to L.

Figure 16:
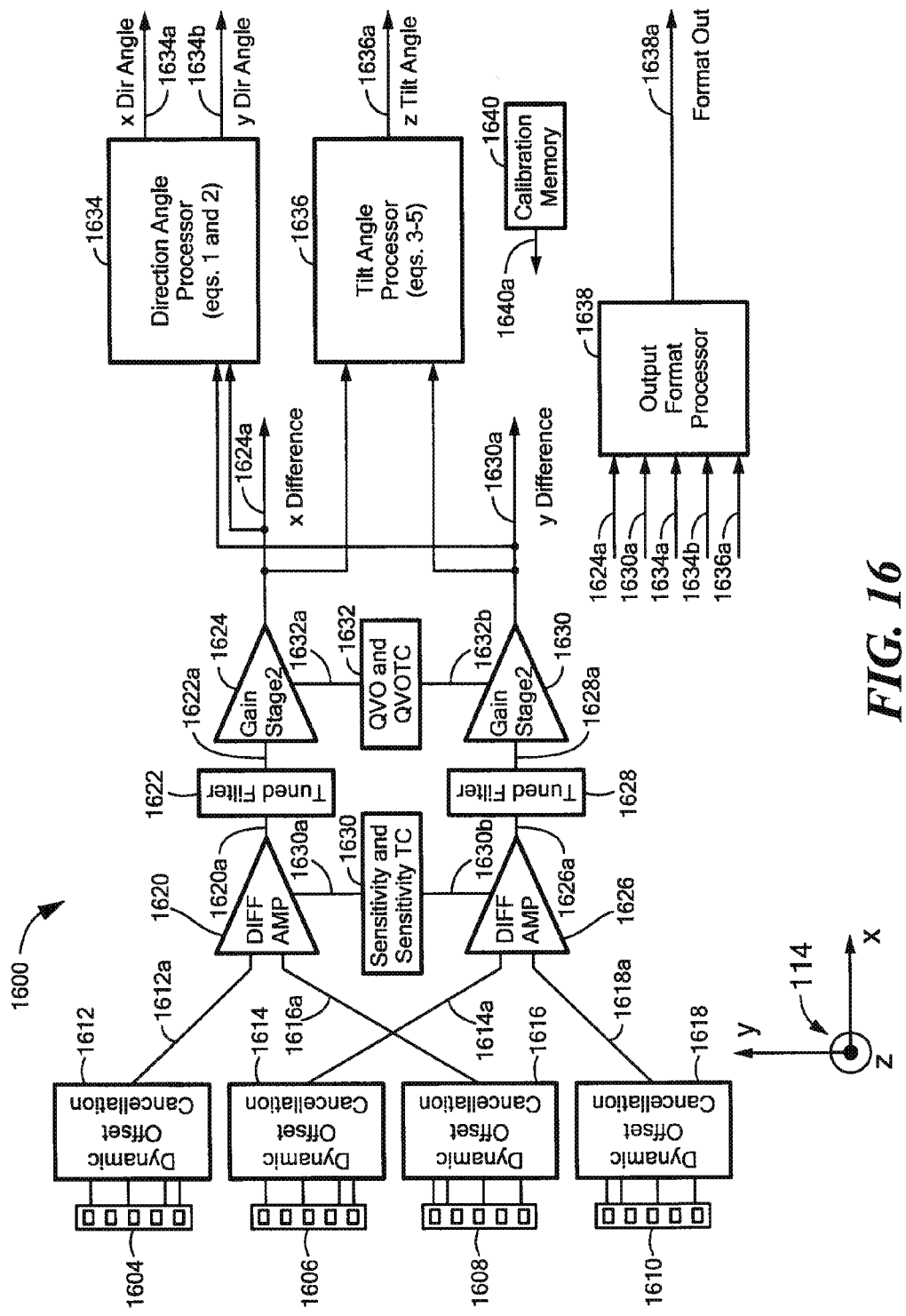
FIG. 16 is a block diagram showing further details of an example of an electronic circuit that can be used as the electronic circuit of FIG. 13.

Referring now to FIG. 16, an electronic circuit 1600 can form a part of a magnetic field sensor and can be disposed upon the electronic substrate 1300. The electronic circuit 1600 can include for magnetic field sensing elements 1604, 1606, 1608, 1610, here shown to have graphical shapes representative of vertical Hall elements. From discussion above in conjunction with FIG. 13, physical arrangement and maximum response axes will be understood. Here, however the four magnetic field sensing elements 1604, 1606, 1608, 1610 are shown in a line for clarity of the block diagram.

In some embodiments, the four magnetic field sensing element 1604, 1606, 1608, 1610 can be coupled to so-called "dynamic offset cancellation" modules 1612, 1614, 1616, 1618, respectively. The dynamic offset cancellation modules 1612, 1614, 1616, 1618 perform the above-described current spinning or chopping.

Output signals from the dynamic offset cancellation module 1612, 1614, 1616, 1618 are coupled to first and second differential amplifiers 1620, 1626 as shown.

In some alternate embodiments, there are no dynamic offset cancellation modules, and instead, the differential output signals from the four vertical Hall elements 1604, 1606, 1608, 6010 coupled directly to first and second differential amplifier 1620, 1626, respectively.

It is intended that signals associated the four magnetic field sensing elements 1604, 1606, 1608, 1610 couple to proper ones of the first and second differential amplifiers 6020, 6028. In essence, referring briefly to FIG. 13, it is intended that the signals associated with the vertical Hall elements 1302b, 1302d couple to the first differential amplifier 1620, and signals associated with the vertical Hall elements 1302a, 1302c coupled to the second differential amplifier 1628. Thus, it should be appreciated that the first differential amplifier 1620 is associated with an x-axis electronic channel and the second differential amplifier 1626 is associated with a y-axis electronic channel.

The first differential amplifier 1620 is configured to generate an x difference signal 1620a.

An electronic filter 1622 can be coupled to receive the x difference signal 1620a and configured to generate a filtered signal 1622a. In some embodiments, the tuned filter 1622 is a low pass filter able to pass DC signals, but acting to reduce electronic noise.

A gain stage 1624 can be coupled to receive the filtered signal 1622a and configured to generate an amplified x difference signal 1624a.

The second differential amplifier 1626 is configured to generate a y difference signal 1626a.

An electronic filter 1628 can be coupled to receive the y difference signal 1626a and configured to generate a filtered signal 1628a. In some embodiments, the tuned filter 1628 is a low pass filter able to pass DC signals, but acting to reduce electronic noise.

A gain stage 1630 can be coupled to receive the filtered signal 1628a and configured to generate an amplified y difference signal 1630a.

The electronic circuit 1600 can include a direction angle processor 1634 coupled to receive the x difference signal 1624a and coupled to receive the y difference signal 1630a. By use of equations one and two above, the direction angle processor 1634 is configured to generate at least one of an x direction angle signal 1634a or a y direction angle signal 1634b.

The electronic circuit can include a tilt angle processor 1634 coupled to receive the x difference signal 1624a and coupled to receive the y difference signal 1630a. By use of equations three, four, and five above, the tilt angle processor 1634 is configured to generate a z tilt angle signal 1636a.

In some embodiments, the direction angle processor 1634 and/or the tilt angle processor 1636 are analog processors. However, in other embodiments, the direction angle processor 1634 and/or the tilt angle processor 1636 are digital processors. For these digital embodiments, analog-to digital converters (DACS) (not shown) are disposed between the gain stages 1624, 1628 and the processors 1634, 1636.

In other embodiments, analog to digital conversions are made earlier, for example, prior to the tuned filters 1622, 1628, and the tuned filters 1622, 1628 are digital filters, and circuits that follow are digital circuits.

In some alternate embodiments, the electronic circuit 1600 does not include the tilt angle processor 1636. In some other alternate embodiments, the electronic circuit 1600 does not include the direction angle processor 1634. In some other alternate embodiments, the electronic circuit 1600 does not include the direction angle processor 1634 or the tilt angle processor 1636.

In some embodiments, the x difference signal 1624a and the y difference signal 1630a are provided to other circuits that are not a part of the electronic circuit 1600.

It should be understood that the x difference signal 1624a and the y difference signal 1630a provide an ability to reject common mode responses of individual magnetic field sensing elements used in the difference signals that may respond in-part to z-components of magnetic fields between the first and second magnets of FIGS. 1-12. Other circuits described below have two magnetic field sensing elements or three magnetic field sensing elements.

In some embodiments, the electronic circuit 1600 can include an output format processor 1636 coupled to receive one or more of the signals 1624a, 1630a, 1634a, 1634b, 1636a and configured to generate a serial or parallel output signal 1638a having information related to the one or more of the received signals. Example formats of the signal 1638a include, but are not limited to, a SENT format, and SPI format, and I²C format, and a serial format.

In some embodiments, the electronic circuit 1600 can include a calibration memory 1640 configured to store and provide calibration values 1640a, for example, according to the calibration described above in conjunction with FIG. 15.

While two parallel channels are shown in the electronic circuit 1600, other arrangements are also possible. For example, in one alternate embodiment samples from the four magnetic field sensing elements 1604, 1606 1608, 1610 are taken sequentially in a time division multiplexed (TDM) arrangement. The samples can be digitized, filtered, amplified, and sent to the common processor for processing equivalent to processing described above in conjunction with equations one through five.

Referring briefly to equations (1) and (2) above, it should be recognized that the x difference signal 1620a and the y difference signal 1620b are relatively independent from each other with movement or rotation of the second magnet, e.g., 104 of FIG. 1, due to their differential nature. Namely, a rotation or movement of the second magnet (e.g., 104 of FIG. 1) in the x direction, results in a change of the x difference signal 1620a, but results in little or no change of the y difference signal 1626a, and vice versa. Being independent, equations (1) and (2) can generate particularly accurate x direction angles and y direction angels, however, the calibration values 1640a can also provide further calibration related to equations (1) and (2).

Figure 17:
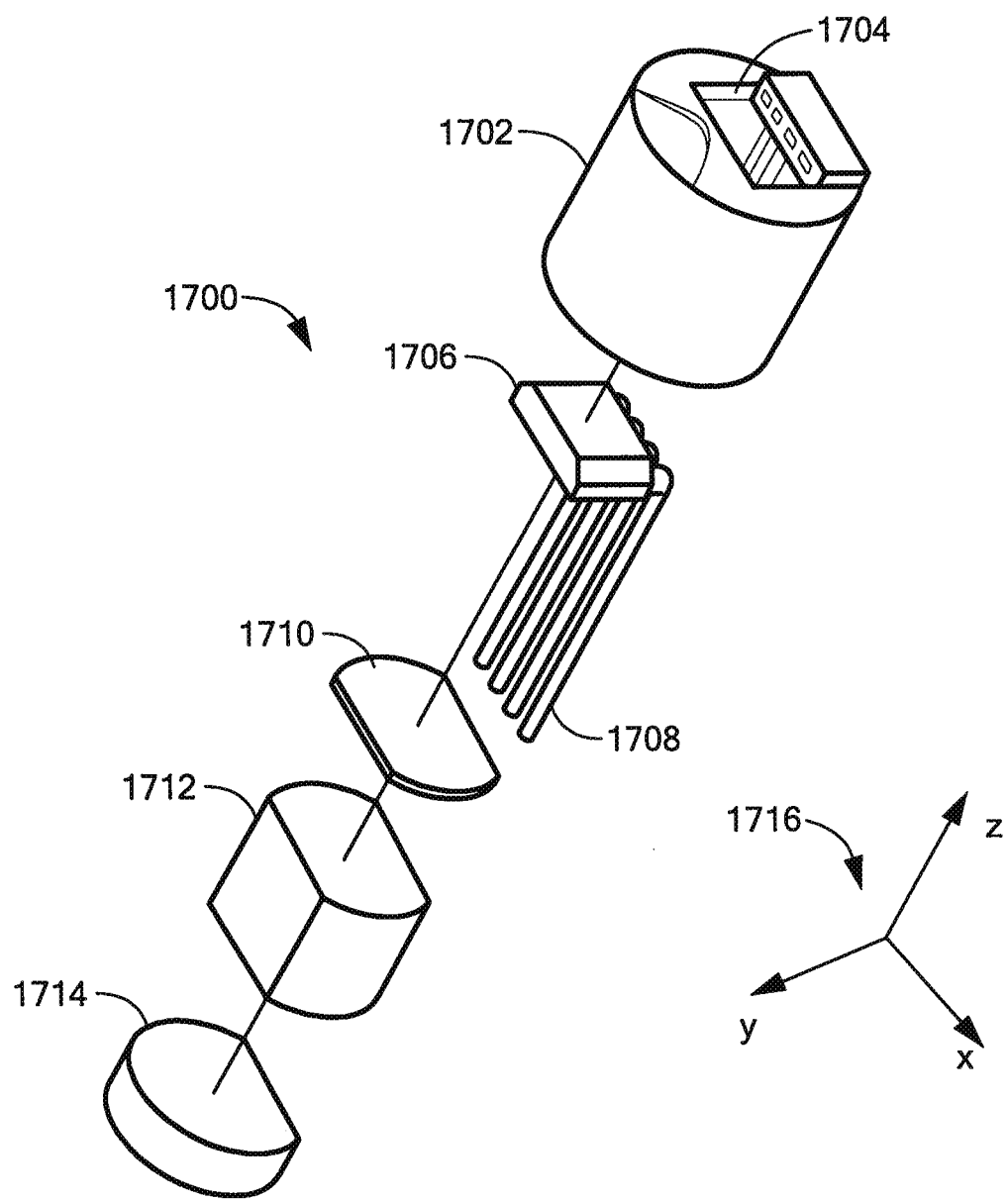
FIG. 17 is an exploded view of an example of a magnetic field sensor that can include the electronic circuit of FIGS. 13 and 16 and the first magnet described above to form part of the above-described magnetic assemblies.

Referring now to FIG. 17, a magnetic field sensor 1700 can include an integrated circuit 1706, which, for example, can be a packaged version of the electronic circuit 1600 of FIG. 16.

The magnetic field sensor 1700 can include a housing 1702 having a cavity 1704.

The magnetic field sensor 1700 can include a spacer, for example, an insulating spacer 1710.

The magnetic field sensor 1700 can include a magnet 1712, which can be the same as or similar to the magnets 110, 910 described in figures above.

The magnetic field sensor 1700 can also include a ceiling member 1714.

While the magnetic field sensor 1700 is shown in exploded form, the magnetic field sensor 1700 is shown and assembled form in FIG. 18 below.

Figure 18:
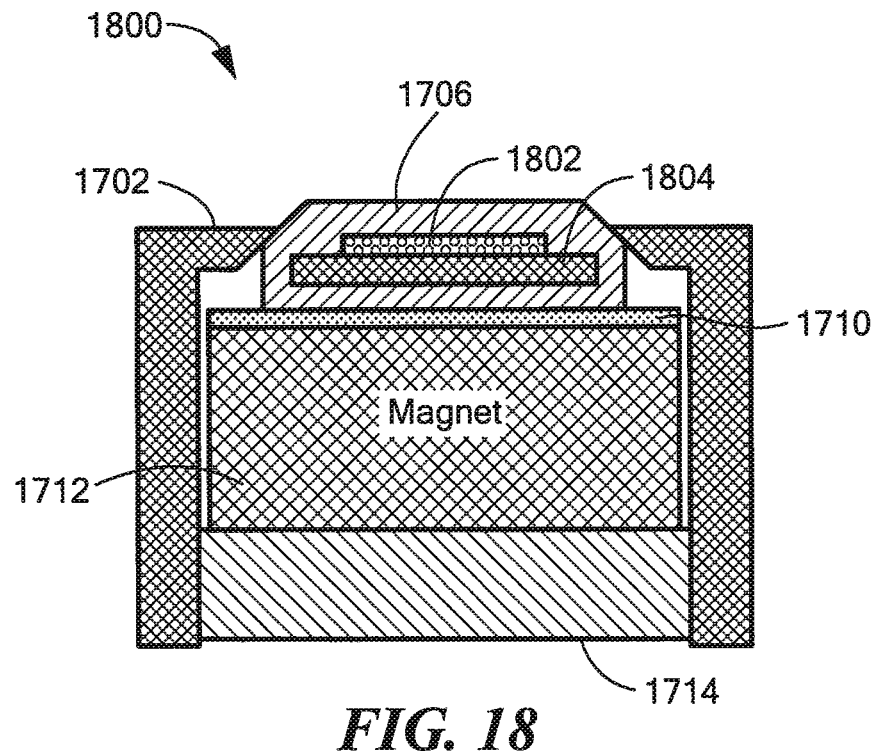
FIG. 18 is a side view cross section of the magnetic field sensor of FIG. 17 when assembled.

Referring now to FIG. 18, in which like elements of FIG. 17 are shown having like reference designations, a magnetic field sensor 1800 is the same as or similar to the magnetic field sensor 1700 of FIG. 17, but is here shown and assembled form.

The integrated circuit 1706 can include an electronic substrate 1802 disposed over a base plate 1804 of a lead frame. The integrated circuit 1706 can include a molding, for example, a plastic molding 1806.

It will be appreciated that the above described second magnets, e.g., 104, 904 and associated cavities 106, 502, 906 can be disposed over the magnetic field sensor 1800.

It will be apparent that, the arrangement of the magnetic field sensor 1800 includes the magnet 1712. However, in other embodiments the magnetic field sensor only includes the integrated circuit 1706.

Figure 19:
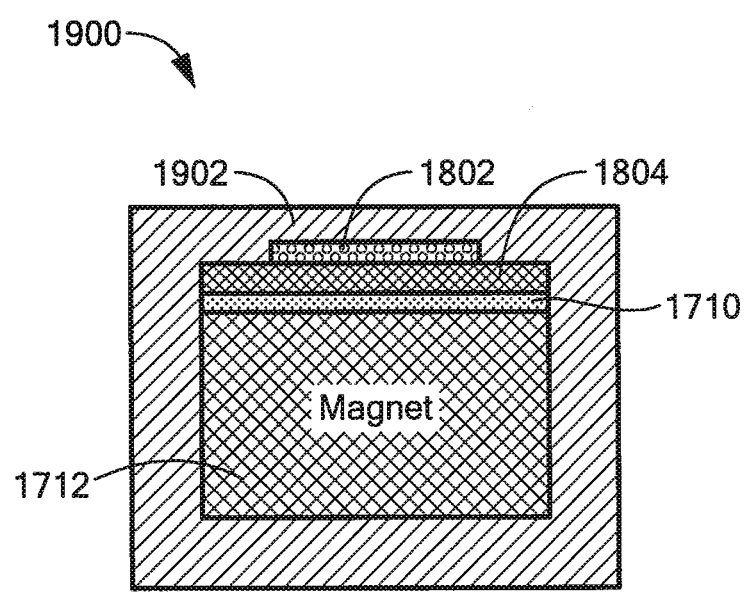
FIG. 19 is a side view cross section of another magnetic field sensor that can include the electronic circuit of FIGS. 13 and 16 and the first magnet described above to form part of the above-described magnetic assemblies.

Referring now to FIG. 19, in which like elements of FIG. 17 are shown having like reference designations, another magnetic field sensor 1900 can include an electronic substrate 1802 disposed over a base plate 1804. Here, however, instead of the plastic molding 1806 of FIG. 18, the magnetic field sensor 1900 includes but one molded structure 1902 surrounding electronic circuit substrate 1802, the base plate 1804, the insulating spacer 1710, and the magnet 1712.

It will be appreciated that the above described second magnets, e.g., 104, 904 and associated cavities 106, 502, 906 can be disposed over the magnetic field sensor 1900.

In some alternate embodiments, the magnetic field sensor 1900 does not include the magnet 1712.

Figure 20:
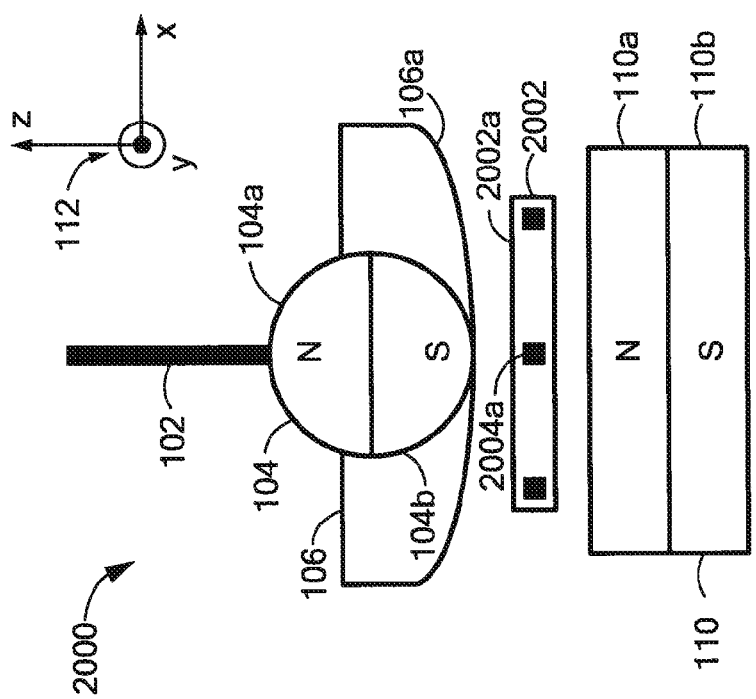
FIG. 20 is a side view showing yet another magnetic assembly having first and second magnets and an electronic substrate disposed between the first and second magnets.

Referring now to FIG. 20, in which like elements of FIG. 1 are shown having like reference designators, a magnetic assembly 2000 is like the magnetic assembly 100 of FIG. 1, but the magnetic assembly 2000 has a different substrate 2002 with a surface 2002a, and with a different quantity of magnetic field sensing elements, e.g. 2004a, shown in described in more detail below in conjunction with FIG. 21. An attractive force of first and second magnets 110, 104 results in a restoring force upon the second magnet 104, and therefore, upon the shaft 102

Figure 21:
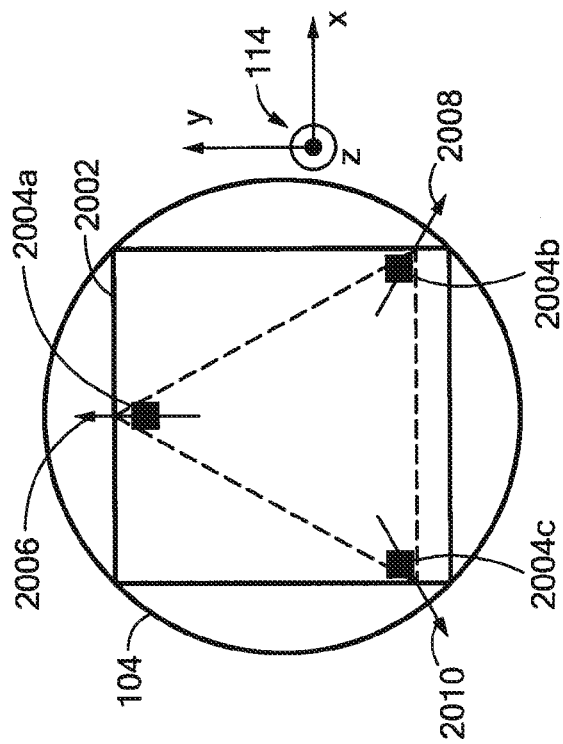
FIG. 21 is a top view of the magnetic assembly of FIG. 20.

Referring now to FIG. 21, in which like elements of FIG. 20 are shown having like reference designations, the substrate 2002 can have a plurality of magnetic field sensing elements, e.g., three magnetic field sensing elements 2004a, 2004b, 2004c. The three magnetic field sensing elements 2004a, 2004b, 2004c can have directional maximum response axes 2006, 2008, 2010, each parallel to the surface 2004a of the substrate 2004, but each pointing in a different direction.

In some embodiments, signals generated by the three magnetic field sensing elements 2004a, 2004b, 2004c are amplified, digitized, and provided as inputs to a processor. The processor can be configured to generate at least an x signal and a y signal. The x signal can be representative of, for example, a projected x-axis value indicative of a projection of the shaft 102 upon the x-axis of the x-y plane. The y signal can be representative of, for example, a projected y-axis value indicative of a projection of the shaft 102 upon the y-axis of the x-y plane.

To generate the x signal and the y signal, the above described processor can use equations different than equations 1 and 2 above. In some embodiments, the processor can use equations the same as or similar to equations described in U.S. patent application Ser. No. 13/960,910, filed Aug. 7, 2013, and entitled "Systems and Methods for Computing a Position of a Magnetic Target," which is assigned to the assignee of the present invention, and which is incorporated by reference herein in its entirety. These equations are described below.

In some embodiments, the above described processor can also use equations the same as or similar to equations 3, 4, and/or 5 described above to compute direction angles and/or a tilt angle. Discussion of calibration above also applies to the magnetic assembly 2000.

Figure 22:
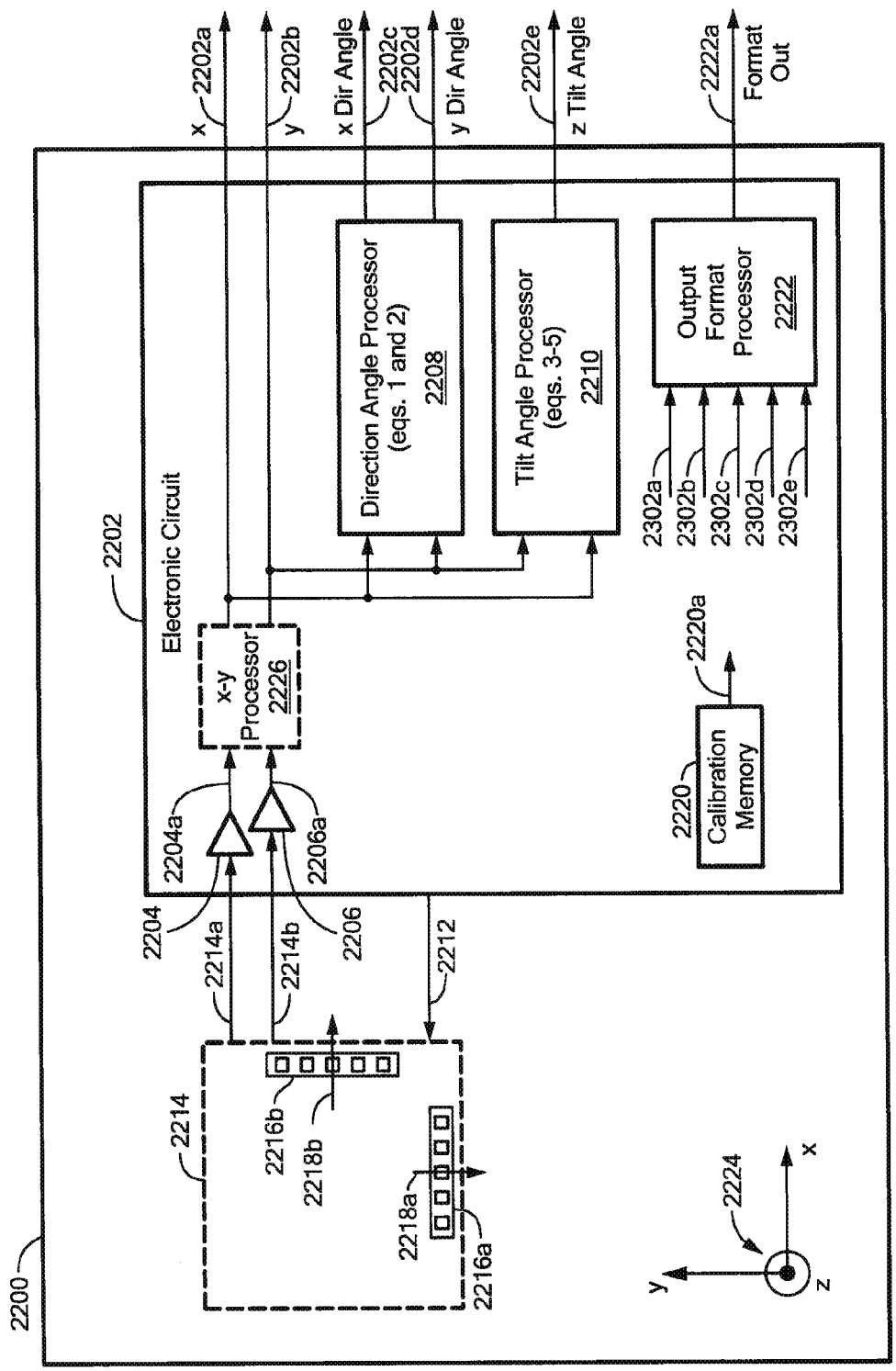
FIG. 22 is a top view of an electronic substrate having two magnetic field sensing elements and an electronic circuit that can be used as one of the above-mentioned electronic substrates.

Referring now to FIG. 22, an electronic substrate 2200 can be the same as or similar to the electronic substrates 108, 908 described above. However, unlike the substrates 108, 908, which can include four magnetic field sensing elements, upon the electronic substrate 2200 can be disposed two magnetic field sensing elements, for example, first and second magnetic field sensing elements 2216a, 2216b, respectively.

The first and second magnetic field sensing elements 2216a, 2216b are shown in a form representative of vertical Hall elements. Vertical hall elements are described above.

Accordingly, the first and second magnetic field sensing elements 2216a, 2216b have respective first and second directional maximum response axes 2218a, 2218b respectively. The directional maximum response axes 2218a, 2218b have the same characteristics as the maximum response axes 116, 118 of FIG. 2.

Current spinning or chopping can be used with the magnetic field sensing elements 2216a, 2216b as described above in conjunction with FIG. 13.

The first magnetic field sensing elements 2216a can generate a first electronic magnetic field signal 2214a, which is responsive to magnetic fields in the y direction, and second magnetic field sensing elements 2216b can generate a second electronic magnetic field signal 2214b, which is responsive to magnetic fields in the x direction.

The first and second electronic magnetic field signals 2214a, 2214b can be differential signals, each generated by a respective individual magnetic field sensing element, but are here shown as individual connections.

An electronic circuit 2202 can include first and second amplifiers 2204, 2206 coupled to receive the first and second magnetic field signals 2214a, 2214b, respectively and configured to generate first and second respective amplified signals 2204a, 2206a, respectively.

Optionally, the electronic circuit 2200 can include an x-y processor 2226 coupled to receive the first and second amplified signals 2204a, 2206a, configured to apply a calibration, and configured to generate an x signal 2202a and a y signal 2202b, respectively. This calibration is described more fully below. In other arrangements, the first and second amplified signals 2204a, 2206 can essentially bypass the x-y processor 2226.

The electronic circuit 2202 can also be configured to generate one or more drive signals 2212 that can drive the magnetic field sensing elements 2216a, 2216b.

It will be apparent that, having the two magnetic field signals 2214a, 2214b, there need not be a difference of signals, e.g., via differential amplifiers 1620, 1626 of FIG. 16 that would be used for four magnetic field signals. Instead, the x signal 2202a and the y signal 2202b can be indicative of responses from individual ones of the first and second magnetic field sensing elements 2218a, 2218b, respectively.

With non-differencing arrangements, unlike the differencing of signals of the magnetic field sensor 1600 of FIG. 16, the electronic magnetic field signals 2214a, 2214b are not necessarily fully independent. In other words, a movement of the shaft 102 of FIGS. 1 and 2 in the y direction might result not only result in a desired change of the electronic magnetic field single 2214a responsive to the y direction, but also in some undesirable change of the electronic magnetic field signal 2214b in the x direction. However, even with the above described arrangement that bypasses the x-y processor, still the x signal 2202a and the y signal 2202b might be sufficiently independent to result in sufficiently accurate signals among an x direction angle value 2202c, a y direction value 2202d, and a z tilt angle value 2202e described below.

As described above, angles (e.g., of the shaft 102 of FIG. 3) projected in the x-y plane are referred to herein as direction angles. A direction angle can be an x direction angle relative to the x-axis, or a y direction angle relative the x-axis. Angles (e.g., of the shaft 102 of FIG. 3) relative to the z-axis are referred to herein as tilt angles.

The electronic circuit 2202 is configured to generate one or more output signals, which can include, but which are not limited to, the x signal 2202a (a non-difference signal) representative of, for example, a projection of the shaft 102 of FIG. 3 upon the x-axis of the x-y plane, the y signal 2202b (a non-difference signal) representative of, for example, a projection of the shaft 102 of FIG. 3 upon the y-axis of the x-y plane, the x direction angle signal 2202c representative of, for example, a projection of the shaft 102 of FIG. 3 in the x-y plane and relative to the x-axis, the y direction angle signal 2202d representative of; for example, a projection of the shaft 102 of FIG. 3 projected in the x-y plane and relative to the y-axis, or the z tilt angle 2202e representative of, for example, a z tilt angle of the shaft 102 of FIG. 3 relative to the z-axis perpendicular to the x-y plane.

In some embodiments, the first and second magnetic field sensing elements 2216a, 2216b, respectively, here shown to be vertical Hall elements, can instead be magnetoresistance elements. Magnetoresistance elements are not used with current spinning or chopping.

In operation, referring briefly to FIG. 14, values of the signal 1402 can be representative of the magnetic field signal 2214a as an end of the shaft 102 of FIG. 3 is moved around a circle. Similarly, values of the signal 1404 of FIG. 14 can be representative of the magnetic field signal 2214b as an end of the shaft 102 of FIG. 3 is moved around a circle. Thus, compared to the four sinusoids of FIG. 14, for the arrangement of FIG. 22, there can be only two sinusoids.

Referring briefly to equations 1-5 above, similar computations for the x direction angle, the y direction angle, the z tilt angle, and for all computations of equations 1-5 can be used with the magnetic field sensor 2200 of FIG. 22, but, in equation (1) and (2) using the x and y signals 2202a, 2202b, respectively, rather than the x difference signal and y difference signal described above in conjunction with FIG. 13.

In some embodiments, the electronic circuit 2202 can include a calibration memory 2220 to store and provide calibration values 2220a that can be used with the x-y processor 2226 to enhance independence of the x signal 2202a and the y signal 2202b.

In some embodiments, the calibration memory 2220 is also configured to store and provide the calibration values 2220a, for example, according to the calibration described above in conjunction with FIG. 15.

In some embodiments, the electronic circuit 2202 can include an output format processor 2222 the same as or similar to the output format processor 1638 of FIG. 16.

Figure 23:
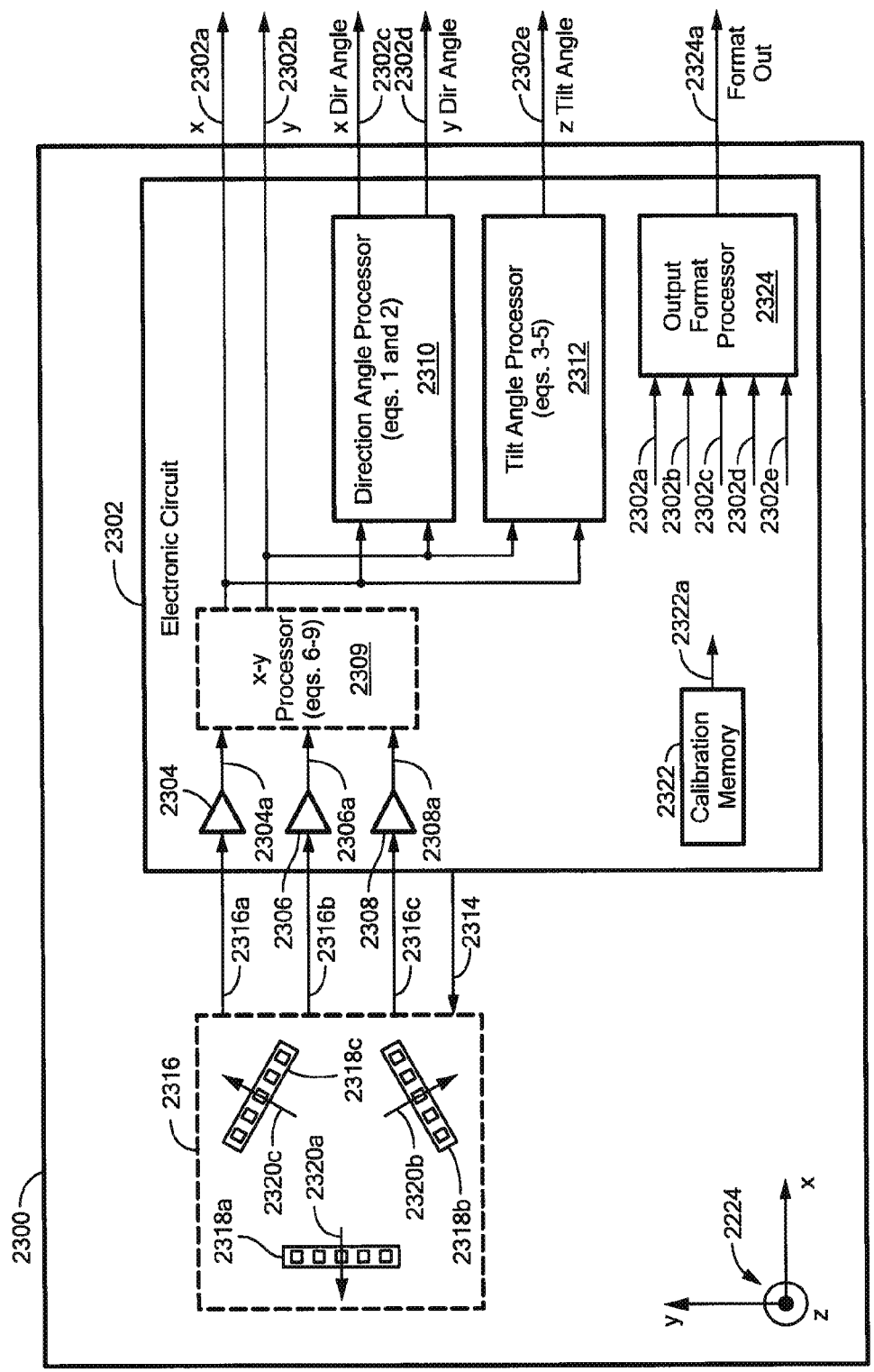
FIG. 23 is a top view of an electronic substrate having three magnetic field sensing elements and an electronic circuit that can be used as one of the above-mentioned electronic substrates.

Referring now to FIG. 23, an electronic substrate 2300 can be the same as or similar to the electronic substrates 108, 908 described above. However, unlike the substrates 108, 908, which can include four magnetic field sensing elements, upon the electronic substrate 2300 can be disposed three magnetic field sensing elements, for example, first, second, and third magnetic field sensing elements 2318a, 2318b, 2318c, respectively. The first, second, and third magnetic field sensing elements 2318a, 2318b, 2318c can be the same as or similar to the three magnetic field sensing elements 2006, 2008, 2010 of FIGS. 20 and 21.

Accordingly, the first, second, and third magnetic field sensing elements 2318a, 2318b, 2318c have respective first, second, and third directional maximum response axes 2314a, 2314b, 2314c, respectively. The directional maximum response axes 2314a, 2314b, 2314c have the same characteristics as the direction maximum response axes 2006, 2008, 2010 of FIG. 21.

Current spinning or chopping can be used with the magnetic field sensing elements 2318a, 2318b, 2318c as described above in conjunction with FIG. 13.

The first, second, and third magnetic field sensing elements 2318a, 2318b, 2318c can generate a respective first, second and third electronic magnetic field signals 2316a, 2316b, 2316c, respectively. In some embodiments, the first, second, and third electronic magnetic field signals 2316a, 2316b, 2316c are differential signals as provided by individual ones of the magnetic field sensing element 2318a, 2318b, 2318c, but are here shown as individual connections.

An electronic circuit 2302 can include first, second, and third amplifiers 2304, 2306, 2308 coupled to receive the first, second, and third magnetic field signals 2316a, 2316b, 2316c, respectively and configured to generate first, second, and third amplified signals 2304a, 2306a, 2308a, respectively.

Optionally, the electronic circuit 2200 can include an x-y processor 2309 coupled to receive the first, second, and third amplified signals 2304a, 2306a, 2308a configured to apply a calibration, and configured to generate an x signal 2302a and a y signal 2302b, respectively. This calibration is described more fully below.

The electronic circuit 2302 can also be configured to generate one or more drive signals 2314 that can drive the magnetic field sensing elements 2318a, 2318b, 2318c.

It will be apparent that, having the three magnetic field signals 2318a, 2318b, 2318c, there need not be a difference of signals, e.g., via differential amplifiers 1620, 1626 of FIG. 16 that would be used for four magnetic field signals. Instead, the x signal 2302a and the y signal 2302b can be indicative of responses from combined ones of the first, second, and third magnetic field sensing elements 2318a, 2318b, 2318c, respectively, the combination being other than a differencing of pairs of signals.

As described above, angles (e.g., of the shaft 102 of FIG. 3) projected in the x-y plane are referred to herein as direction angles. A direction angle can be an x direction angle relative to the x-axis, or a y direction angle relative the x-axis. Angles (e.g., of the shaft 102 of FIG. 3) relative to the z-axis are referred to herein as tilt angles.

The electronic circuit 2302 is configured to generate one or more output signals, which can include, but which are not limited to, an x signal 2302a (a non-difference signal) representative of, for example, a projection of the shaft 102 of FIG. 3 upon the x-axis of the x-y plane, a y signal 2302b (a non-difference signal) representative of, for example, a projection of the shaft 102 of FIG. 3 upon the y-axis of the x-y plane, an x direction angle signal 2302c representative of, for example, a projection of the shaft 102 of FIG. 3 in the x-y plane and relative to the x-axis, a y direction angle signal 2302d representative of, for example a projection of the shaft 102 of FIG. 3 in the x-y plane and relative to the y-axis, or a z tilt angle signal 2302e representative of, for example, a z tilt angle of the shaft 102 of FIG. 3 relative to the z-axis perpendicular to the x-y plane.

In some embodiments, the first, second, and third magnetic field sensing elements 2318a, 2318b, 2318c, respectively, here shown to be vertical Hall elements, can instead be magnetoresistance elements. Magnetoresistance elements are not used with current spinning or chopping.

In some embodiments, the three magnetic field sensing elements 2318a, 2318b, 2318c are not disposed in an orthogonal arrangement. In some embodiments, the three magnetic field sensing elements 2318a, 2318b, 2318c are arranged one hundred twenty degrees apart.

Referring briefly to the four signals of FIG. 14, it should be apparent that a similar three sinusoidal signals result from the three magnetic field sensing element 2318a, 2318b, 2318c as the shaft 102 of FIG. 1 is moved in a circle, and the three sinusoidal signals can be one under twenty degrees apart in phase.

Referring briefly to equations 1-5 above, similar computations for the x direction angle, the y direction angle, the z tilt angle, and for all computations of equations 1-5 can be used with the magnetic field sensor 2300 of FIG. 23, but, in equation (1) and (2) using the x and y signals 2302a, 2302b, respectively, rather than the x difference signal and y difference value signal described above in conjunction with FIG. 13.

In some embodiments, the electronic circuit 2302 can include a calibration memory 2322 to store and provide calibration values 2322a that can be used with the x-y processor 2309 to enhance independence of the x signal 2302a and the y signal 2302b.

In some embodiments, the calibration memory 2322 is also configured to store and provide the calibration values 2322aa, for example, according to the calibration described above in conjunction with FIG. 15.

As described above, the x-y processor 2309 is coupled to receive the three magnetic field signals 2304a, 2306a, 2308a and configured to generate the x signal 2302a and a y signal 2302b, similar to the x signal 2202a and the y signal 2202b of FIG. 22. To this end, further equations are described below, with which the x-y processor 2309 can convert the three amplified signals 2304a, 2306a, 2308s into Cartesian x and y signals 2302a, 2302b.

In some embodiments, the x-y processor can compute the x and y signals 2302a, 2302b using each one of the amplified signals 2304a, 2306a, 2308a, essentially averaging the amplified signals together. To this end, a geometric consideration is provided below As a geometric consideration and assuming that the second magnet 102 of FIG. 1 experiences not only rotation but translation of the second magnet 102 as would be apparent from the arrangement of FIG. 1, the x-y processor 2309 can use the output signals of each magnetic field sensing elements 2318a, 2318b, 2318c to compute an x coordinate position of the shaft, and a y position of the shaft, e.g., 102 of FIG. 1. The x-y processor 2309 can essentially average output signals from the three magnetic field sensing elements 2318a, 2318b, 2318c to increase accuracy of the computation.

For example, if the magnetic field sensing elements 2318a, 2318b, 2318c are placed relative one hundred twenty degree apart as shown, then equation (6) can be used to compute an x position of the second magnet, e.g., 104:

$$X = F - \left(\frac{G+H}{2}\right) \quad (6)$$

where:
X is an x position (which is related to the x value 2302a) of the second magnet, e.g., 104, in an x direction;
F is a distance between the magnetic field sensing element 2318a and a center of the second magnet, e.g., 104;
G is a distance between the magnetic field sensing element 2318b and the center of the second magnet, e.g., 104; and
H is a distance between magnetic field sensing element 2318c and the center of the second magnet, e.g., 104.

It should be understood that the distances F, G, and H are related to values of the magnetic field signals 2316a, 2316b, 2316c, respectively. Rotation amounts of the second magnet 104 can be used in place of the above distances.

In another embodiment, equation (7) can be used to compute the X position of the second magnet, e.g., 104:

$$X = \frac{(X_{2312a} + D_{2312a}) + (X_{2312b} - D_{2312b}\cos(60)) + (X_{2312c} - D_{231ca}\cos(60))}{3}, \quad (7)$$

where:
X is an x position (which is related to the x value 2302a) of the second magnet, e.g., 104, in an x direction;
$X_{2318a}$ is an x projected position in an x-y plane of the magnetic field sensing element 2318a.
$D_{2318a}$ is a distance between the magnetic field sensing element 2318a and the center of the second magnet, e.g., 104.
$X_{2318b}$ is an x projected position in the x-y plane of the magnetic field sensing element 2318b;
$D_{2318b}$ is the distance between the magnetic field sensing element 2318b and the center of the second magnet, e.g., 104.
$X_{1312c}$ is an x projected position in the x-y plane of the magnetic field sensing element 2318c.
$D_{2318c}$ is the distance between the magnetic field sensing element 2318c and the center of the second magnet, e.g., 104.

It should be understood that the distances above are related to values of the magnetic field signals 2316a, 2316b, 2316c. Rotation amounts of the second magnet 104 can be used in place of the above distances.

Using the same example, equation (8) can be used to compute a Y position of second magnet, e.g., 104:

$$Y = \sin(90)/\sin(120) * \left(\frac{3*G}{2} - \frac{3*H}{2}\right) \quad (8)$$

where:
Y is a y position (which is related to the y value 2302b) of the second magnet, e.g., 104, in a y direction;
G is the distance between the magnetic field sensing element 2318b and the center of the second magnet, e.g., 104; and
H is the distance between magnetic field sensing element 2318c and the center of the second magnet, e.g., 104

It should be understood that the distances G and H are related to values of the magnetic field signals 2316b, 2316c, respectively. Rotation amounts of the second magnet 104 can be used in place of the above distances.

In another embodiment, equation (9) can be used to compute the Y position of magnetic target 102:

$$Y = \frac{(Y_{2312b} + D_{2312b}\cos(30)) + (Y_{2312c} - D_{2312c}\cos(30))}{2}, \quad (9)$$

where:
Y is a y position (which is related to the y value 2302b) of the second magnet, e.g., 104, in a y direction;
$Y_{2318b}$ is a y projected position in the x-y plane of the magnetic field sensing element 2318b;
$D_{2318b}$ is a distance between the magnetic field sensing element 2318b and the center of the second magnet, e.g., 104;
$Y_{2318c}$ is a y projected position in the x-y plane of magnetic field sensing element 2318c; and
$D_{2318c}$ is a distance between magnetic field sensing element 2318c and the center of the second magnet, e.g., 104.

It should be understood that the distances above are related to values of the magnetic field signals 2316a, 2316b, 2316c. Rotation amounts of the second magnet 104 can be used in place of the above distances.

In equation (9), the distance between magnetic field sensing element 2318a and the center of the second magnet, e.g., 104, is not used because the magnetic field sensing element 2318a is positioned to sense distance directly along the x axis. Therefore, the distance measured by magnetic field sensing element 2318a (and associated y value of this element) does not include a y projected position.

These above equations are provided as examples only. The equations above may be used, for example, if the magnetic field sensing elements are arranged in 120 degree increments (as shown in FIG. 23). Other equations may be used if the sensing elements are placed in other positions. For example, the magnetic field sensing elements may be placed at +/−forty-five degrees from a center element, at +/−sixty degrees from a center element, at +/−ninety degrees from a center element, or an any other placement. Also, the magnetic field sensing elements 2318a, 2318b, 2318c need not be placed in regular spacing. For example, there can be any angle A between the magnetic field sensing element 2318a and the magnetic field sensing element 2318b and there can be any angle B between the magnetic field sensing 2318a and the magnetic field sensing elements 2318c. The angles A and B need not be the same angle.

Depending on the arrangement of the magnetic field sensing elements, the angles between them, different formulas may be used to compute the above X and Y positions.

It will also be apparent that, if the second magnet 102 of FIG. 1 is arranged to rotate without translation, other equations can be used to determine the X and Y positions. In some embodiments, the equations used to compute the X and Y positions may be adjusted to alter sensitivity, accuracy, timing, or other parameters related to the position of second magnet 104.

As described above, where the second magnet 104 of FIG. 1 experiences translation of the second magnet 104, sensing the x and y position of second magnet 104 provides the x signal 2302a and the y signal 2302b, resulting in computation of the z tilt angle signal 2302e, the x direction angle signal 2302c, and the y direction angle signal 2302d using equations described above.

All references cited herein are hereby incorporated herein by reference in their entirety. Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

What is claimed is:

1. A magnetic assembly, comprising:
   a first magnet having north and south magnetic poles;
   a second magnet having north and south magnetic poles;
   a movable shaft fixedly coupled to the second magnet such that movement of the movable shaft results in movement of the second magnet relative to the first magnet such that a line between centers of the north and south magnetic poles of the second magnet is movable relative to a line between the north and south magnetic poles of the first magnet, wherein an attraction of the second magnet to the first magnet result in a restoring force upon the shaft; and
   a magnetic field sensor disposed between the first and second magnets, wherein the magnetic field sensor comprises an electronic circuit, comprising:
   a substrate having a major surface disposed in an x-y plane, wherein the line between centers of the north and south magnetic poles of the first magnet is perpendicular to the x-y plane;
   first, second, third, and fourth Magnetic field sensing elements disposed upon the major surface of the substrate and configured to generate first, second, third and fourth respective electronic magnetic field signals, wherein each electronic magnetic field signal is responsive to a respective magnetic field parallel to the major surface of the substrate, wherein the first and third magnetic field sensing elements have respective first and third maximum response axes parallel to each other, directed in opposite directions, and parallel the major surface of the substrate, and wherein the second and fourth magnetic field sensing elements have respective second and fourth maximum response axes parallel to each other, directed in opposite directions, and parallel the major surface of the substrate, wherein the first and third major response axes are not parallel to the second add fourth major response axes;
   a first differential circuit coupled to the first and third magnetic field sensing elements and configured to generate a first difference signal related to a difference between the first and third electronic magnetic field signals; and
   a second differential circuit coupled to the second and fourth magnetic field sensing elements and configured to generate a second difference signal related to a difference between the second and fourth electronic magnetic field signals, wherein the first difference signal has an amplitude related to an x-axis projection upon the x-y plane and the second difference signal has an amplitude related to a y-axis projection upon the x-y plane.

2. The magnetic assembly of claim 1, wherein the electronic circuit further comprises a direction angle processor coupled to receive signals representative of the first and second difference signals and configured to generate at least one of an x direction angle signal or a y direction angle signal, wherein the x direction angle signal is representative of an angle relative to an x-axis in an x-y plane, and wherein the y direction angle signal is representative of an angle relative to a y-axis in the x-y plane.

3. The magnetic assembly of claim 2, wherein the electronic circuit further comprises a tilt angle processor coupled to receive signals representative of the first and second difference signals and configured to generate a z tilt angle signal representative of an angle relative to a z-axis in x-y-z Cartesian coordinates having the x-y plane.

4. The magnetic assembly of claim 1, wherein the electronic circuit further comprises a tilt angle processor coupled to receive signals representative of the first and second difference signals and configured to generate a z tilt angle signal representative of an angle relative to a z-axis in x-y-z Cartesian coordinate.

5. The magnetic assembly of claim 1, wherein either the north pole of the second magnet is proximate to the south pole of the first magnet or the south pole of the second magnet is proximate to the north pole of the first magnet.

6. The magnetic assembly of claim 1, further comprising a cavity into which the second magnet is movably disposed.

7. The magnetic assembly of claim 1, further comprising a cavity into which the second magnet is movably disposed, wherein a shape of the cavity and a shape of the second magnet are selected to restrict movement of the second magnet is a direction parallel to the major surface of the substrate.

8. The magnetic assembly of claim 1, wherein the second magnet is spherical.

9. The magnetic assembly of claim 1, wherein the second magnet is disk shaped.

10. The magnetic assembly of claim 1, wherein the second magnet is disk shaped and has a central void disposed proximate to the electronic circuit.

11. The magnetic assembly of claim 1, wherein the first magnet is disk shaped.

12. The magnetic assembly of claim 1, wherein the first magnet is disk shaped and has a central void disposed proximate to the electronic circuit.

13. The magnetic assembly of claim 1, wherein a first line between centers of the first and third magnetic field sensing elements is perpendicular to a second line between centers of the second and fourth magnetic field sensing elements, wherein the first and third major response axes are perpendicular to the second and fourth major response axes.

14. The magnetic assembly of claim 1, wherein the first, second, third, and fourth magnetic field sensing elements are magnetoresistance elements.

15. The magnetic assembly of claim 1, wherein the first, second, third, and fourth magnetic field sensing elements are vertical Hall elements.

16. A method of sensing a position of a magnet, comprising:
  providing a first magnet having north and south magnetic poles;
  providing a second magnet having north and south magnetic poles;
  providing a movable shaft fixedly coupled to the second magnet such that movement of the movable shaft results in movement of the second magnet relative to the first magnet such that a line between centers of the north and south magnetic poles of the second magnet is movable relative to a line between the north and south magnetic poles of the first magnet, wherein an attraction of the second magnet to the first magnet result in a restoring force upon the shaft; and
  providing a magnetic field sensor disposed between the first and second magnets, wherein the magnetic field sensor comprises an electronic circuit, comprising:
    a substrate having a major surface disposed in an x-y plane, wherein the line between centers of the north and south magnetic poles of the first magnet is perpendicular to the x-y plane;
    first, second, third, and fourth magnetic field sensing elements disposed upon the major surface of the substrate and configured to generate first, second, third and fourth respective electronic magnetic field signals, wherein each electronic magnetic field signal is responsive to a respective magnetic field parallel to the major surface of the substrate, wherein the first and third magnetic field sensing elements have respective first and third maximum response axes parallel to each other, directed in opposite directions, and parallel the major surface of the substrate, and wherein the second and fourth magnetic field sensing elements have respective second and fourth maximum response axes parallel to each other, directed in opposite directions, and parallel the major surface of the substrate, wherein the first and third major response axes are not parallel to the second and fourth major response axes;
    generating a first difference signal related to a difference between the first and third electronic magnetic field signals; and
    generating a second difference signal related to a difference between the second and fourth electronic magnetic field signals, wherein the first difference signal has an amplitude related to an x-axis projection upon the x-y plane and the second difference signal has an amplitude related to a y-axis projection upon the x-y plane.

17. The method claim 16, further comprising
  generating at least one of an x direction angle signal or a y direction angle signal, wherein the x direction angle signal is representative of an angle relative to an x-axis in an x-y plane, and wherein the y direction angle signal is representative of an angle relative to a y-axis in the x-y plane.

18. The method of claim 17, further comprising:
  generating a z tilt angle signal representative of an angle relative to a z-axis in x-y-z Cartesian coordinates having the x-y plane.

19. The method of claim 16, further comprising:
  generating a z tilt angle signal representative of an angle relative to a z-axis in x-y-z Cartesian coordinates.

20. A magnetic field sensor, comprising: a magnet disposed in a fixed relationship with and proximate to a substrate, the substrate having a major surface disposed in an x-y plane; and
  an electronic circuit operable to sense a position of a movable shaft, the electronic circuit, comprising:
  the substrate;
    a plurality of magnetic field sensing elements disposed upon the major surface of the substrate and configured to generate a respective plurality of electronic magnetic field signals, wherein each electronic magnetic field signal is responsive to a respective magnetic field parallel to the major surface of the substrate, wherein the plurality of magnetic field sensing elements have respective maximum response axes directed in different directions and parallel to the major surface of the substrate;
    a direction angle processor coupled to the plurality of magnetic field sensing elements and configured to generate a first signal and a second signal, wherein the first signal has an amplitude related to an x-axis projection upon the x-y plane and the second signal has an amplitude related to a y-axis projection upon the x-y plane; and
    a tilt angle processor coupled to the plurality of magnetic field sensing elements and configured to generate a z tilt angle signal representative of an angle of the moveable shaft relative to a z-axis in x-y-z Cartesian coordinates having the x-y plane.

21. The magnetic field sensor of claim 20, wherein the plurality of magnetic field sensing elements consists of two or three magnetic field sensing elements.

22. The magnetic field sensor of claim 21, wherein the plurality of magnetic field sensing elements consists of three magnetic field sensing elements, and wherein the three magnetic field sensing elements are arranged in a triangular arrangement in the x-y plane.

23. A magnetic assembly, comprising:
  a first magnet having north and south magnetic poles;
  a second magnet having north and south magnetic poles;
  a movable shaft fixedly coupled to the second magnet such that movement of the movable shaft results in movement of the second magnet relative to the first magnet such that a line between centers of the north and south magnetic poles of the second magnet is movable relative to a line between the north and south magnetic poles of the first magnet, wherein an attraction of the second magnet to the first magnet result in a restoring force upon the shaft; and a magnetic field sensor disposed between the first and second magnets, wherein the magnetic field sensor comprises an electronic circuit, comprising:

a substrate having a major surface disposed in an x-y plane, wherein the line between centers of the north and south magnetic poles of the first magnet is perpendicular to the x-y plane;

a plurality of magnetic field sensing elements disposed upon the major surface of the substrate and configured to generate a respective plurality of electronic magnetic field signals, wherein each electronic magnetic field signal is responsive to a respective magnetic field parallel to the major surface of the substrate, wherein the plurality of magnetic field sensing elements have respective maximum response axes directed in different directions and parallel to the major surface of the substrate; and a direction angle processor coupled to the plurality of magnetic field sensing elements and configured to generate a first signal and a second signal, wherein the first signal has an amplitude related to an x-axis projection upon the x-y plane and the second signal has an amplitude related to a y-axis projection upon the x-y plane; and a tilt angle processor coupled to the plurality of magnetic field sensing elements and configured to generate a z tilt angle signal representative of an angle of the moveable shaft relative to a z-axis in x-y-z Cartesian coordinates having the x-y plane.

24. The magnetic field sensor of claim 23, wherein the plurality of magnetic field sensing elements consists of two or three magnetic field sensing elements.

25. The magnetic field sensor of claim 24, wherein the plurality of magnetic field sensing elements consists of three magnetic field sensing elements, and wherein the three magnetic field sensing elements are arranged in a triangular arrangement in the x-y plane.

26. A method of sensing a position of a movable shaft, comprising:

providing a magnet disposed in a fixed relationship with and proximate to a substrate, the substrate having a major surface disposed in an x-y plane;

providing, upon the substrate, a plurality of magnetic field sensing elements disposed upon the major surface of the substrate and configured to generate a respective plurality of electronic magnetic field signals, wherein each electronic magnetic field signal is responsive to a respective magnetic field parallel to the major surface of the substrate, wherein the plurality of magnetic field sensing elements have respective maximum response axes directed in different directions and parallel to the major surface of the substrate;

generating a first signal and a second signal, wherein the first signal has an amplitude related to an x-axis projection upon the x-y plane and the second signal has an amplitude related to a y-axis projection upon the x-y plane; and generating a third signal, wherein the third signal has an amplitude related to an angle of the moveable shaft relative to a z-axis in x-y-z Cartesian coordinates having the x-y plane.

27. The method of claim 26, wherein the plurality of magnetic field sensing elements consists of two or three magnetic field sensing elements.

28. The method of claim 27, wherein the plurality of magnetic field sensing elements consists of three magnetic field sensing elements, and wherein the three magnetic field sensing elements are arranged in a triangular arrangement in the x-y plane.

29. A method of sensing a position of a magnet, comprising:

providing a first magnet having north and south magnetic poles;

providing a second magnet having north and south magnetic poles;

providing a movable shaft fixedly coupled to the second magnet such that movement of the movable shaft results in movement of the second magnet relative to the first magnet such that a line between centers of the north and south magnetic poles of the second magnet is movable relative to a line between the north and south magnetic poles of the first magnet, wherein an attraction of the second magnet to the first magnet result in a restoring force upon the shaft; and providing a magnetic field sensor disposed between the first and second magnets, wherein the magnetic field sensor comprises an electronic circuit, comprising:

a substrate having a major surface disposed in an x-y plane, wherein the line between centers of the north and south magnetic poles of the first magnet is perpendicular to the x-y plane; and a plurality of magnetic field sensing elements disposed upon the major surface of the substrate and configured to generate a respective plurality of electronic magnetic field signals, wherein each electronic magnetic field signal is responsive to a respective magnetic field parallel to the major surface of the substrate, wherein the plurality of magnetic field sensing elements have respective maximum response axes directed in different directions and parallel to the major surface of the substrate, wherein the method further comprises:

generating a first signal and a second signal, wherein the first signal has an amplitude related to an x-axis projection upon the x-y plane and the second signal has an amplitude related to a y-axis projection upon the x-y plane, and generating a third signal, wherein the third signal has an amplitude related to an angle of the moveable shaft relative to a z-axis in x-y-z Cartesian coordinates having the x-y plane.

30. The method of claim 29, wherein the plurality of magnetic field sensing elements consists of two or three magnetic field sensing elements.

31. The method of claim 30, wherein the plurality of magnetic field sensing elements consists of three magnetic field sensing elements, and wherein the three magnetic field sensing elements are arranged in a triangular arrangement in the x-y plane.

* * * * *

UNITED STATES PATENT AND TRADEMARK OFFICE
CERTIFICATE OF CORRECTION

PATENT NO. : 10,066,964 B2
APPLICATION NO. : 15/419242
DATED : September 4, 2018
INVENTOR(S) : Ali Husain Yusuf Sirohiwala et al.

It is certified that error appears in the above-identified patent and that said Letters Patent is hereby corrected as shown below:

Column 5, Line 51, delete "result in" and replace with --results in--

Column 6, Line 41, delete "of signal" and replace with --of a signal--

Column 8, Line 36, delete "describe and" and replace with --describe an--

Column 8, Lines 39-40, delete "as used to" and replace with --is used to--

Column 10, Line 5, delete "that a similar" and replace with --that similar--

Column 10, Line 52, delete "by user" and replace with --by a user--

Column 11, Line 39, delete "cavity surface 908a" and replace with --cavity surface 906a--

Column 13, Line 30, delete "x-axis" and replace with --y-axis--

Column 13, Line 65, delete "in with a" and replace with --with a--

Column 15, Line 11, delete "of magnetic assemblies" and replace with --of the magnetic assemblies--

Column 16, Line 2, delete "tilt angle" and replace with --tilt angles--

Column 16, Line 50, delete "coupled" and replace with --are coupled--

Column 16, Line 51, delete "amplifier" and replace with --amplifiers--

Column 16, Line 55, delete "6020, 6028" and replace with --1620, 1626--

Column 16, Line 60, delete "amplifier 1628" and replace with --amplifier 1626--

Signed and Sealed this
Eighth Day of January, 2019

Andrei Iancu
*Director of the United States Patent and Trademark Office*

CERTIFICATE OF CORRECTION (continued)
U.S. Pat. No. 10,066,964 B2

Column 17, Line 25, delete "1634" and replace with --1636--

Column 17, Line 28, delete "1634" and replace with --1636--

Column 17, Line 35, delete "1624, 1628" and replace with --1624, 1630--

Column 17, Line 64, delete "and SPI" and replace with --an SPI--

Column 17, Line 65, delete "and I$^2$C" and replace with --an I$^2$C--

Column 18, Line 14, delete "1620b" and replace with --1626a--

Column 18, Line 39, delete "shown and" and replace with --shown in--

Column 18, Line 44, delete "shown and" and replace with --shown in--

Column 19, Line 8, delete "shown in" and replace with --shown and--

Column 20, Line 16, delete "2200" and replace with --2202--

Column 20, Line 22, delete "2206" and replace with --2206a--

Column 20, Line 40, delete "only result in" and replace with --only in--

Column 20, Lines 53-54, delete "angle relative the x-axis" and replace with --angle relative to the y-axis--

Column 21, Line 50, delete "2314a, 2314b, 2314c" and replace with --2320a, 2320b, 2320c--

Column 21, Line 51, delete "2314a, 2314b, 2314c" and replace with --2320a, 2320b, 2320c--

Column 22, Line 4, delete "2200" and replace with --2302--

Column 22, Line 27, delete "x-axis" and replace with --y-axis--

Column 22, Line 58, delete "one under twenty" and replace with --one hundred twenty--

Column 23, Line 28, delete "of each magnetic" and replace with --of each of the magnetic--

Column 23, Line 37, delete "degree apart" and replace with --degrees apart--